United States Patent
Shrivastava

(10) Patent No.: US 10,312,885 B2
(45) Date of Patent: Jun. 4, 2019

(54) SELF-MATCHING PHASE SHIFTER/ATTENUATOR

(71) Applicant: pSemi Corporation, San Diego, CA (US)

(72) Inventor: Ravindranath Shrivastava, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 23 days.

(21) Appl. No.: 15/433,914

(22) Filed: Feb. 15, 2017

(65) Prior Publication Data
US 2018/0234080 A1    Aug. 16, 2018

(51) Int. Cl.
| H03K 5/13 | (2014.01) |
|---|---|
| H03H 11/20 | (2006.01) |
| H03H 11/28 | (2006.01) |
| H03H 11/24 | (2006.01) |
| H03H 7/20 | (2006.01) |
| H03H 7/25 | (2006.01) |
| H03H 7/38 | (2006.01) |

(52) U.S. Cl.
CPC ............. *H03H 11/20* (2013.01); *H03H 7/20* (2013.01); *H03H 7/25* (2013.01); *H03H 11/245* (2013.01); *H03H 11/28* (2013.01); *H03H 7/38* (2013.01)

(58) Field of Classification Search
None
See application file for complete search history.

(56) References Cited

U.S. PATENT DOCUMENTS

| 6,804,502 | B2 | 10/2004 | Burgener et al. | |
|---|---|---|---|---|
| 7,910,993 | B2 | 3/2011 | Brindle et al. | |
| 9,831,857 | B2* | 11/2017 | Facchini | H03K 5/13 |
| 9,917,613 | B1* | 3/2018 | Bacon | H04B 1/00 |
| 2014/0009214 | A1* | 1/2014 | Altunkilic | H03K 17/161 |
| | | | | 327/427 |
| 2016/0134259 | A1* | 5/2016 | Shrivastava | H03H 11/245 |
| | | | | 327/308 |

* cited by examiner

*Primary Examiner* — Cassandra F Cox
(74) *Attorney, Agent, or Firm* — Jaquez Land Greenhaus LLP; Martin J. Jaquez, Esq.; Bruce W. Greenhaus, Esq.

(57) ABSTRACT

A self-matching phase shifter/attenuator including several incremental impedance matched phase shifter/attenuator elements is disclosed. Each incremental impedance matched phase shifter element comprises a reactive component (such as either a capacitor or inductor) that can be coupled in shunt to the signal path. The shunt reactive component is coupled in series with a ground switch. When closed, the ground switch connects the shunt reactive component to ground. When the ground switch is open, the switch removes the shunt reactive component from the circuit. In addition, each incremental impedance matched phase shifter element comprises a series reactive component having a reactance that is typically equal and inverse of that of the shunt reactive component.

21 Claims, 22 Drawing Sheets

SELF-MATCHING PHASE SHIFTER/ATTENUATOR

BACKGROUND (1) Technical Field

Various embodiments described herein relate to phase shifters and attenuators and more particularly to variable phase shifters and attenuators having self-matching impedance.

(2) Background

From time to time, it is desirable to be able to variably alter the phase of an electrical signal within an electrical circuit. A phase shift is a movement along the time axis of a signal in which voltage or current is plotted against time. FIG. 1 shows a solid line 101 representing three periods of a first sine wave plotted with voltage in the vertical axis and time in the horizontal axis. A dotted line 103 represents three periods of a second sine wave shifted by 90 degrees with respect to the first sine wave 101. It can be seen that the second sine wave 103 is a perfect replica of the first sine wave 101 with the exception of the phase shift (i.e., the sliding along the time axis). Accordingly, it can be said that the sine wave 101 was shifted 90 degrees without any distortion.

A variable phase shifter is a circuit in which a signal coupled to an input port of the phase shifter is shifted in phase and coupled to an output port. FIG. 2 is an illustration of one phase shifter 200 in which the amount of the phase shift can be varied. The variable phase shifter 200 uses several incremental phase shifter elements 202 coupled in series. Each is capable of either providing an incremental phase shift. Alternatively, each of the incremental phase shifter elements 202 can be bypassed (i.e., the signal shunted around that particular incremental phase shifter element 202). In some cases, it is desirable for the variable phase shifter 202 to be able to select the amount of phase shift in very fine discrete steps, such as steps of 0.25 degrees.

FIG. 3a and FIG. 3b illustrate two ways in which the incremental phase shifter elements 202 of FIG. 2 can be implemented. In the case of the phase shifter 202a shown in FIG. 3a, an impedance device 301, such as a capacitor (as shown in FIG. 3a) or an inductor (not shown for the sake of simplicity) having a reactance Z1 is connected to a switch $M_1$. One terminal of the impedance device 301 is coupled to a conductor coupled between an RF (radio frequency) input port 305 and an RF output port 307 of the incremental phase shifter element 202a. The other terminal of the impedance device 301 is coupled to a first terminal of the switch $M_1$. The second terminal of the switch $M_1$ is coupled to ground. Accordingly, when the switch $M_1$ is closed, the impedance device 301 shunts the signal to ground. Adding the impedance device 301 will cause a phase shift, the magnitude of which is determined by both the amount of reactance $Z_1$ and the frequency of the signals applied to the input of the incremental phase shifter element 202a. In some cases, a phase shifter with relatively small discrete step size can be achieved using a capacitive incremental phase shifter element, such as the element 202a shown in FIG. 3a.

FIG. 3b illustrates an alternative architecture for implementing the incremental phase shifter element 202. The incremental phase shifter element 202b comprises an impedance device 301 having a reactance $Z_1$, such as an inductor having an inductance $Z_1$ (as shown in FIG. 3b) or a capacitor having a capacitance $Z_1$ (not shown for the sake of simplicity) coupled between an RF input port and an RF output port. A switch $M_1$ is coupled in parallel with the impedance device 301. When the switch $M_1$ is open, the signal passes through the impedance device 301. The impedance device 301 causes a phase shift. The magnitude of the shift is determined by the amount of reactance $Z_1$. Alternatively, when the switch $M_1$ is closed, the signal flows through the switch $M_1$ and so bypasses the impedance device 301. Accordingly, with $M_1$ closed, there is ideally no phase shift imposed on the signal as it passes through the incremental phase shifter element 202b.

However, in some instances there is a problem with using a phase shifter such as the phase shifter 200 having elements such as those shown in FIGS. 3a and 3b. Using incremental phase shifter elements 202a, 202b that rely on a reactive device (such as a capacitor or inductor) to induce the phase shift results in a reactive impedance being imposed on the input and output of the phase shifter 202. The amount of the reactive impedance is dependent upon the amount of the shift imposed by the element 202a, 202b. For example, FIG. 4 is an illustration of a schematic of a capacitive variable phase shifter 202a. As the size of the phase shift imposed on the signal increases, the amount of capacitive loading required to achieve the desired phase shift also increases. Therefore, the input and output impedance of the phase shifter will vary depending upon the amount of phase shift being applied to the signal. In some instances, this can be problematic, since it may be important to maintain an input and output impedance that is matched to the components coupled to the input and the output of the phase shifter to prevent reflections, distortion and loss of power as the signal traverses the circuit. The same problem is also present if the phase shifter 200 is designed using the circuit block 202b with several elements 202b connected in series. That is, as the user increases the number of active phase shifter elements 202, the RF lines get longer. This results in more inductive reactance, thereby disrupting the impedance match and increasing reflections on the RF line. The more elements 202b are added, the worse the return loss gets. Therefore, even if the each element 202 is well matched, using several elements 202 in series will negatively affect the overall impedance match and increase the return loss.

Therefore, there is a currently a need for a variable phase shifter that can self correct the impedance to match the impedance of the circuits to which the phase shifter is coupled at its input and output over a range of selectable phase shifts.

SUMMARY OF THE INVENTION

A self-matching variable phase shifter/attenuator including several incremental impedance matched phase shifter/attenuator elements is disclosed. Each incremental impedance matched phase shifter element comprises a reactive component (such as either a capacitor or inductor) that can be coupled in shunt to the signal path. The shunt reactive component is coupled in series with a ground switch. When closed, the ground switch connects the shunt reactive component to ground. When the ground switch is open, the switch removes the shunt reactive component from the circuit. In addition, each incremental impedance matched phase shifter element comprises a series reactive component having a reactance that is typically equal and inverse of that of the shunt reactive component. For example, if the shunt reactive component has an inductive reactance then the series reactive component will have a capacitive reactance. Similarly, each incremental impedance matched attenuation element comprises a shunt resistive component and an associated series resistive component.

In the phase shifter, the series reactive component is coupled in series with the signal path. A bypass switch operates in coordination with the ground switch. In a first embodiment, the closing of ground switches is alternated with the opening of bypass switches. By ensuring that the number of ground switches that are closed is no greater than one more than the number of bypass switches that are open, the impedance at the input and output of the self-matching variable phase shifter self corrects the impedance as additional phase shift steps are implemented. In a second embodiment, whenever a ground switch is closed, an associated bypass switch is opened. In either embodiment, any number of incremental impedance matched phase shifter elements can be coupled in series to form a self-matching variable phase shifter having a broad range of phase shifts selectable in relatively small discrete steps. In other embodiments, larger phase shift steps can be used, assuming the increase in return loss introduced by each element that results from using larger phase shift steps is tolerable. Using smaller steps allows the amount of phase shift to be changed while maintaining a relatively constant input and output impedance, resulting in lower return loss.

The details of embodiments of the invention are set forth in the accompanying drawings and the description below. Other features, objects, and advantages of the invention will be apparent from the description and drawings, and from the claims.

Like reference numbers and designations in the various drawings indicate like elements. Furthermore, in the case in which several instances of an element are shown in the same drawing, a unique letter may be appended to the reference number to distinguish between different instances of the element (for example, 502a, 502b, etc. to denote various instances of the element 502).

DETAILED DESCRIPTION OF THE INVENTION

Figure 5:
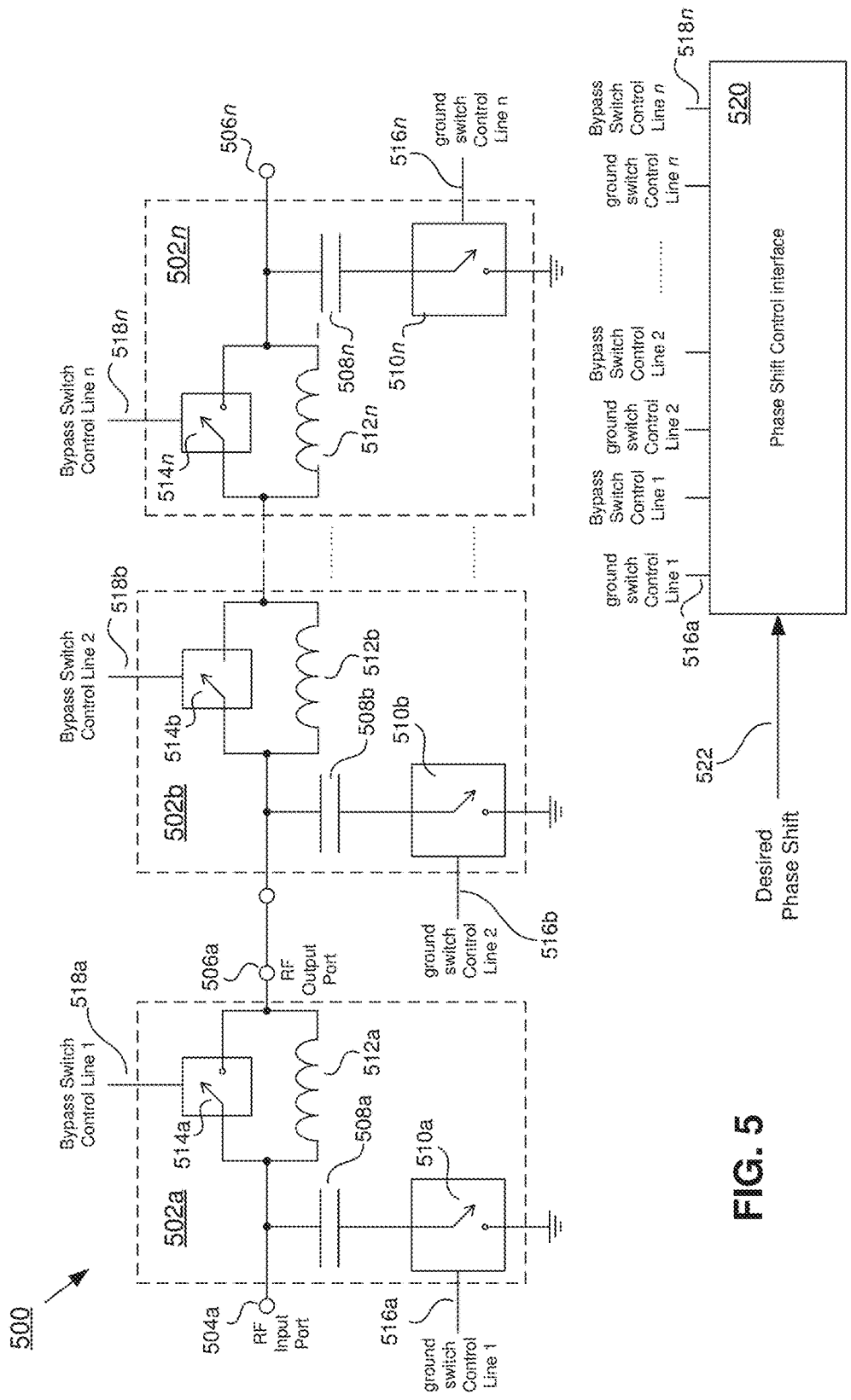
FIG. 5 is an illustration of a phase shifter in accordance with one embodiment of the disclosed method and apparatus.

FIG. 5 is an illustration of a self-matching phase shifter 500 in accordance with one embodiment of the disclosed method and apparatus. In some embodiments, the self-matching phase shifter 500 comprises several impedance matched incremental phase shifter elements 502 (i.e., n such elements 502). Each of the n elements 502 comprise an input port 504, an output port 506, a shunt reactive component, such as a capacitor 508, a series reactive component, such as an inductor 512, a ground switch 510 and an associated bypass switch 514.

Each of the switches 510, 514 is controlled by a switch control line 516, 518. In some embodiments, a phase shift control interface 520 has control signal output ports that output signals to control the switches 510, 514. An input 522 to the phase shift control interface 520 indicates the desired amount of phase shift. In some such embodiments, the phase shift control interface 520 closes one switch for each discrete phase shift step. The amount of the phase shift can be increased one discrete step at a time by activating the ground switches 510 and the bypass switches 514 of each element 502.

For the purpose of this disclosure, the term "active" will indicate that the ground switch 510 is closed or the bypass switch 514 is open. "Inactive" should be taken to mean that the ground switch 510 is open or the bypass switch 514 is closed. Therefore, a phase shift is imparted to the signal when a switch 510, 514 is activated. No phase shift is imparted to the signal when the switches 510, 514 are inactive.

For example, in some embodiments, each element 502 is capable of imposing 2 degrees of phase shift when both the ground switch and the bypass switch are active. In some such embodiments, the phase shifter 500 can be operated to add discrete amounts of phase shift in 1 degree steps by activating the ground switches 510 and the bypass switches 514 one at a time in each of the elements 502. Alternatively, the reactive components 508, 512 can be selected to impose either larger or smaller phase shift steps. For example, in some embodiments, a phase shift step of 6 degrees can be imposed by each element 502. However, it should be understood that the greater the phase shift step, the greater the resulting impedance mismatch will be, and so the greater the return loss attributable to each element 502. For example, the return loss for an element 502 capable of imposing approximately 6 degrees of phase shift may be approximately 15 dB. Nonetheless, it may be possible that for some applications of the self-matching phase shifter 500, such return loss may be tolerable.

In some embodiments in which the impedance is to be well matched, the difference between the number of ground switches 510 that are active and the number of bypass switches 514 that are active should not be greater than one. Therefore, in such embodiments, if two ground switches are active (i.e., closed), one, two or three bypass switches should be active (i.e., open). A third ground switch 510 should be closed before a fourth bypass switch can be opened. Likewise, a third bypass switch 514 should be opened before a fourth ground switch 510 can be closed.

However, in other embodiments in which the impedance of the input and output are not matched, the number of active shunt switches and the number of active ground switches may be significantly different. Accordingly, both impedance matching the input to a first impedance and the output to a different impedance and providing phase shifting can be accomplished together.

Accordingly, in one embodiment, the first phase shift step can be implemented by activating a first ground switch 510. The second phase shift step can then be implemented by activating a bypass switch 514. Additional phase shifts can be implemented in steps of 1 degree by alternating between activating ground switches 510 and bypass switches 514 such that the number of ground switches 410 that are active are always either the same as or one greater than the number of bypass switches 514 that are active.

Alternatively, when there are an odd number of ground switches active and the same number of bypass switches 514 are active, a bypass switch 514 is activated next. At times when there are an even number of ground switches active and the same number of bypass switches 514 active, a ground switch is activated next. Accordingly, the impedance presented at the input and output ports of the self-matching phase shifter 500 will alternate between being slightly capacitive, generally matched and slightly inductive.

In yet another embodiment, when an even number of ground switches are active and the same number of bypass switches 514 are active, a bypass switch 514 is activated next. At times when an odd number of ground switches are active and the same number of bypass switches 514 are active, a ground switch is activated next. It can be seen that this embodiment follows a similar scheme. However, the smallest phase step, rather than being capacitive, will be inductive.

In yet another embodiment, both switches of an element 502 are activated together. Accordingly, the phase shift control interface 520 ensures that when a ground switch 510 is open, the associated bypass switch 514 is closed. In some embodiments, the bypass switch 514 is located within the same element 502 as the ground switch 510 to which it is associated. Likewise, when the phase shift control interface 520 closes a ground switch 510, the associated bypass switch 514 is opened. In this embodiment, the phase shift control interface 520 ensures that the ground switch 510 and the associated bypass switch 514 within the same element 502 are neither both open nor both closed at the same time. The capacitor 508 and the inductor 512 within each element 502 are tuned to a value that provides the desired impedance at both the input and output. In accordance with some embodiments, "tuned to a value" could be based upon values calculated prior to manufacture. Alternatively, the values could be tuned based on "onthe-fly" real-time measurements of impedances, voltages, currents, and/or power levels used to monitor the impedance match between the circuit 500 and circuits coupled to the RF input port 504a and the RF output port 506n. In some such embodiments, the control interface 520 receives inputs that allow it to determine which switches 510, 514 to activate in order to tune to the desired value for the series reactance $Z_{series}$ and the shunt reactance $Z_{shunt}$.

With the ground switch 510 open and the bypass switch 514 closed, the element 502 is configured to pass the signal without a phase shift. Alternatively, with the ground switch 510 closed and the bypass switch 514 open, the element 502 is configured to impart a phase shift to the signal. The size of the phase shift is determined by the value of both the capacitor 508 and the inductor 512.

It should be noted that always activating both switches 510, 514 within an element 502 together provides the best impedance matching performance for each of the steps of the phase shifter 500, assuming that the characteristic impedance $Z_O$ of the system is equal to the square root of the inductance of the series reactance, $Z_{series}$ divided by the capacitance of the shunt reactance, $Z_{shunt}$ (i.e., $Z_O$=sqrt $(Z_{series}/Z_{shunt})$=sqrt(L/C)), where the series reactance, $Z_{series}$ is inductive and the shunt reactance, $Z_{shunt}$ is capacitive. This is because the reactance of the shunt reactive component reduces the negative impact of the series reactance on the impedance match while adding to the phase shift. However, it is possible to make the phase shift steps smaller by activating only one switch 510, 514 at a time. In some cases, the resulting impedance mismatch when there are either more ground switches 510 or bypass switches active will result in performance that is acceptable. In some cases, an acceptable mismatch occurs as long as the ratio of $(Z_{shunt}*Z_{series})/Z_O^2$ is in the range of approximately 0.2 to 2. Some such embodiments use a thermometer configuration in which the value of $Z_{series}$ is substantially smaller than the value of $Z_{shunt}$. This arrangement will provide a relatively low return loss. The particular ratio of $Z_{series}$ to $Z_{shunt}$ depends upon the amount of return loss that can be tolerated. A return loss of approximately −20 dB can be achieved if the ratio of $Z_{shunt}$ to $Z_{series}$ is at least 20 to 1. It should be noted that in some embodiments, a ratio of $(Z_{shunt}*Z_{series})/Z_O^2$ in the range of approximately 0.2 to 2 is be maintained to ensure that when both the series and shunt reactances are enabled, the return loss remains within a desirable range. Each of the reactive elements are activated one at a time (i.e., "thermometer phase shift weights"). In such a case, the step size is equal to the amount of phase shift introduced by adding one additional reactive component (i.e., activating one additional switch 510, 514 associated with a thermometer shift weight). In some embodiments, the capacitors 508 within each element 502 are the same size (i.e., have same amount of capacitance). Likewise, the inductors 512 are all the same size (i.e., all have the same amount of inductance). Therefore, the self-matching phase shifter 500 can be operated as a thermometer controlled phase shifter. In a thermometer controlled phase shifter, the least amount of phase shift is attained when only one switch 510, 514 is active. Activating each additional switch 510, 514 increases the phase shift by an amount equal to the step size.

Since all of the reactive components (i.e., capacitors 508 and inductors 512) of each of the elements 502 have the same value of reactance at the desired operational frequency, each element 502 will impart the same amount of phase shift when the same numbers of switches 510, 514 are active. Therefore, the number of active switches 510, 514 determines the total amount of the phase shift imparted by the self-matching phase shifter 500. In one embodiment, the operational frequency is 1.7 GHz to 2.2 GHz. In other embodiments, the operational frequency range can be either much greater or much lower. In cases in which the frequency is relatively high (e.g., above 20 GHz) it might be useful to implement the capacitive reactance device 508 using an open stub and the inductive reactance device 512 as a microstrip line.

Figure 6:
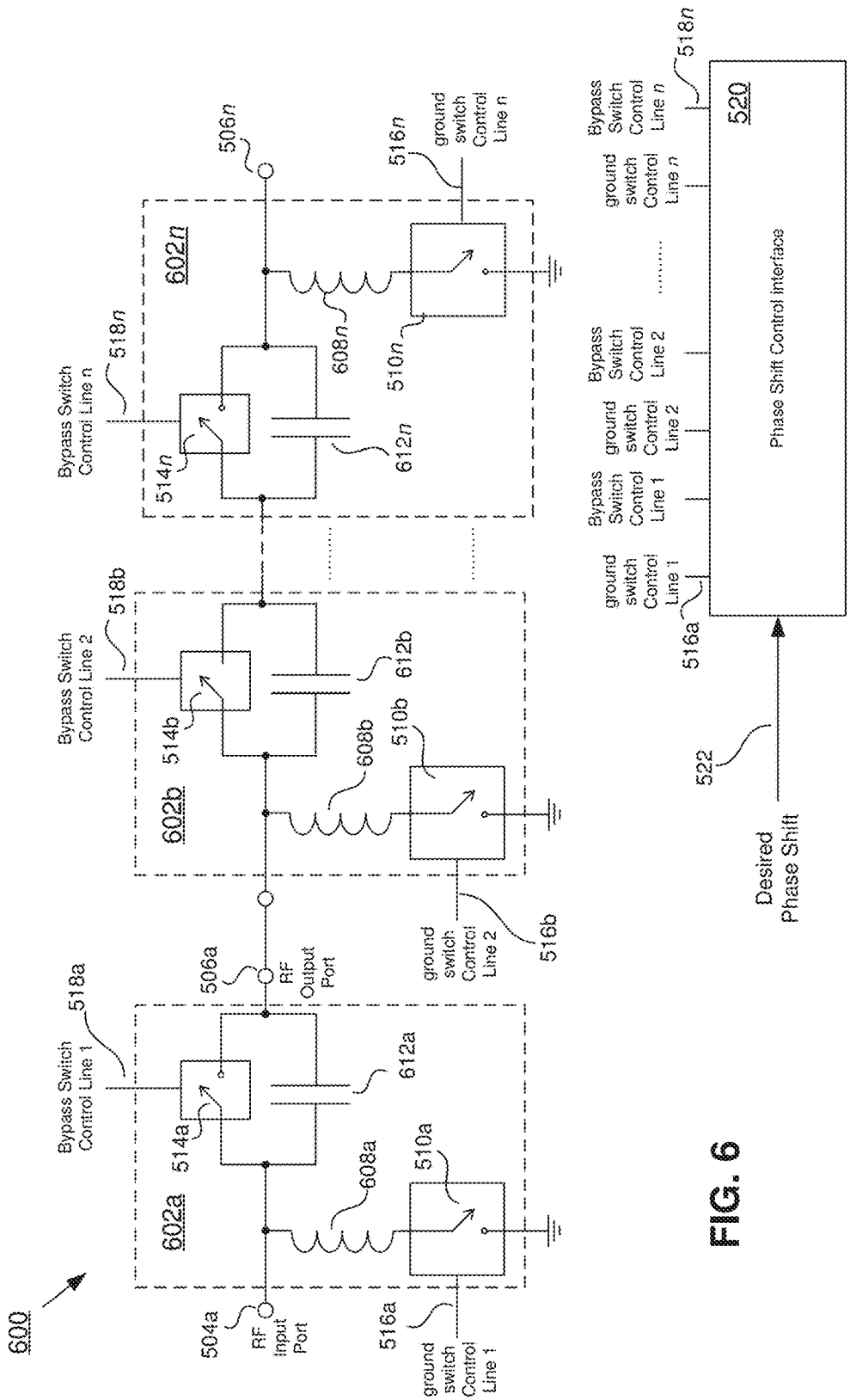
FIG. 6 is an illustration of an embodiment of a self-matching phase shifter 600 similar to the self-matching phase shifter 500 shown in FIG. 5.

FIG. 6 is an illustration of an embodiment of a self-matching phase shifter 600 similar to the self-matching phase shifter 500 shown in FIG. 5. However, the reactive components 508, 512 of FIG. 5 are swapped so that in the active state, each ground switch 510 places an inductive reactance of an inductive device 608, such as an inductor, between the RF input 504 and ground within the element 602. Similarly, when inactive, the bypass switch 514 shunts a capacitive device 612. When active, the bypass switch 514 places the capacitive device 612 in series with the signal path from the RF input port 504 to the RF output port 506 of the element 602. In embodiments intended for use at relatively high frequencies, (i.e., frequencies above the resonant frequency of the reactive components 512 and 508), the circuit 500 of FIG. 5 begins to shunt a significant portion of the signal to ground through the shunt component 508. By placing the inductive component 608 in series with the ground switch 510 and the capacitive component 512 in parallel with the bypass switch 514, frequencies above the resonant frequency of the components 608, 612 (see FIG. 6) will not be significantly shunted to ground. However, frequencies below the resonant frequency will. Therefore, the self-matching phase shifter 600 of FIG. 6 may not be considered efficient for use with frequencies below the resonant frequency of the components 608, 612.

One advantage of the thermometer-based architecture is that it will generally avoid large amplitude and phase glitches. Such glitches can be introduced in a phase shifter in which the values of the reactive components are binary weighted. Nonetheless, in some embodiments, it may be desirable for the values of the reactive components to be binary weighted (i.e., each switch 510, 514 is associated with a binary phase shift weight).

The relative capacitance and inductance values and the manner in which the phase shift control interface 520 operates the switches 510, 514 can be selected to implement one of the following three binary sequences: (1) "Bit Level Binary" sequence; (2) "Mixed Mode Binary" sequence; and (3) "Component Level Binary" sequence.

A "Bit Level Binary" sequence is implemented with the configuration as shown in FIG. 5, in which the capacitive and inductive reactance of each element 502 would be double the capacitive and inductive reactance of the previous element 502. Accordingly, in an embodiment having three elements 502a, 502b, 502c, the value (i.e., capacitance) of the capacitor 508c is twice the value of the capacitor 508b. The value of the capacitor 508b is twice the value of the capacitor 508a. Likewise, the relationship of the values of each inductor 512a, 512b, 512c (i.e., inductance) are similar.

In the Bit Level Binary sequence implemented with three elements 502a, 502b, 502c, as noted above, the two switches 510, 514 within the same element 502 are always activated together. The step size is equal to the phase shift resulting from activation of the switches 510a, 514a (i.e., the switches within the element in which the capacitor and inductor have the smallest values). Accordingly, a binary sequence of 8 steps are possible by activating the three pairs of switches 510a, 510b, 510c, 514a, 514b, 514c, including a zero phase shift when none of the switches 510, 514 are active. It should be noted that activating both of the switches 510, 514 within an element 502 together maintains a desired input and output impedance match for each step of the phase shifter 500.

Figure 7:
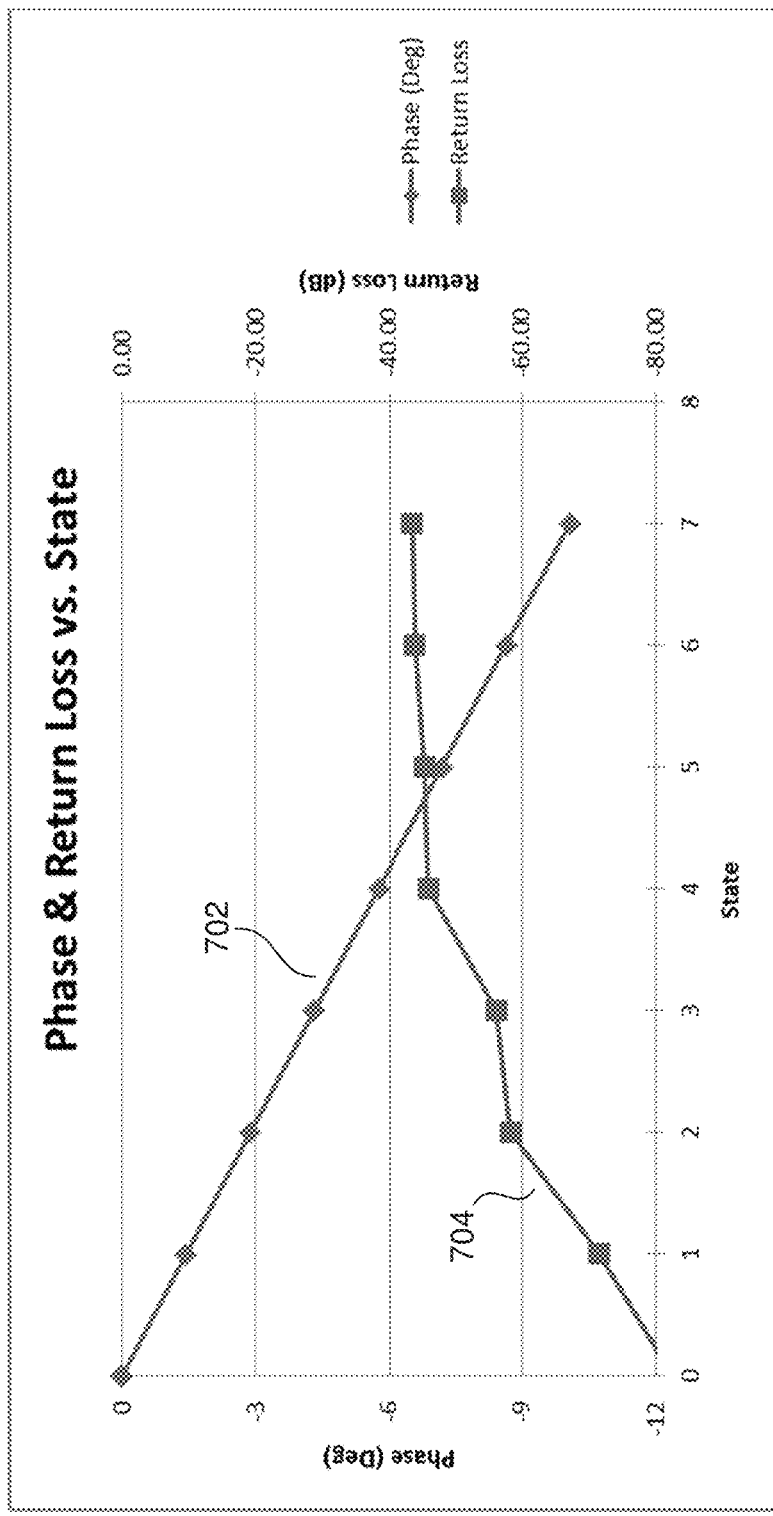
FIG. 7 is a graph of phase shift and return loss for a phase shifter 500 employing a Bit Level Binary sequence.

FIG. 7 is a graph of phase shift and return loss for a phase shifter 500 employing a Bit Level Binary sequence. A first curve 702 shows the amount of phase shift associated with each state of the phase shifter 500. A second curve 704 shows the amount of return loss associated with each state. The phase shift increases monotonically for each of the eight states. Additionally, the return loss generally increases monotonically for each state, with the greatest return loss occurring in the eighth state (STATE "7").

In the Mixed Mode Binary sequence, the capacitors 508 and inductors 512 have values similar to those in the Bit Level Binary sequence. However, the switches 510, 514 are not activated in pairs. That is, each switch 510, 514 can be independently activated. It will be seen that while a configuration having three elements 502a, 502b, 502c allows for $2^6=64$ different combinations of the six different switches 510a, 510b, 510c, 514a, 514b, 514c (i.e., "states"), there are only 15 unique phase shifts that can be attained. That is, several states result in a phase shift of the same magnitude. However, it should also be noted that states that result in the same amount of phase shift will result in return losses of different magnitudes. The difference between the number of ground switches 510 that are active and the number of bypass switches that are active determines the magnitude of the return loss. That is, small differences between the number of ground switches 510 that are active and the number of bypass switches that are active result in lower the return losses.

Figure 8:
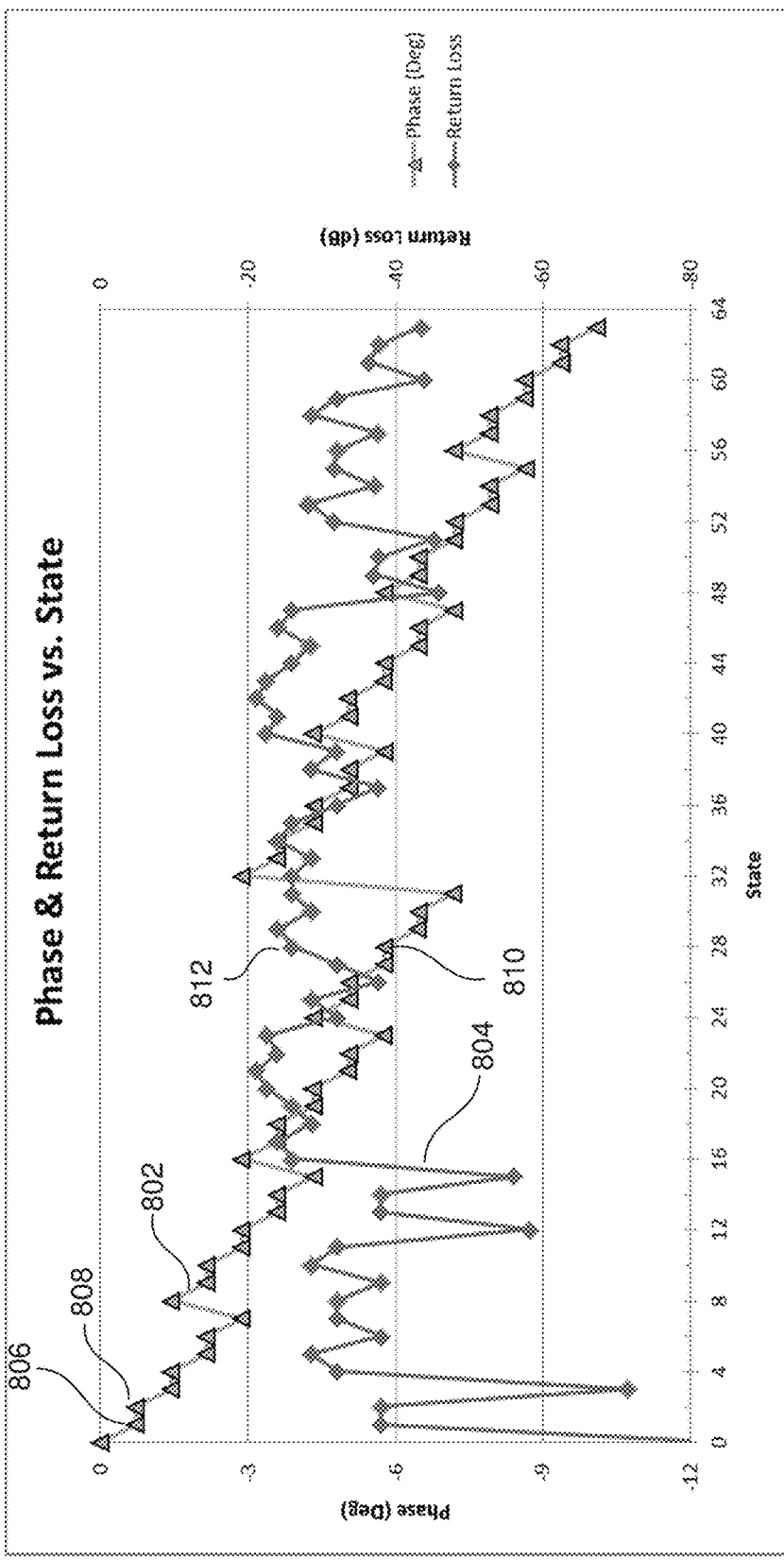
FIG. 8 is a graph of phase shift and return loss for a phase shifter 500 employing a Mixed Mode Binary sequence.

FIG. 8 is a graph of phase shift and return loss for a phase shifter 500 employing a Mixed Mode Binary sequence. A first curve 802 shows the amount of phase shift associated with each state of the phase shifter 500. A second curve 804 shows the amount of return loss associated with each state. Neither the phase shift nor the return loss are monotonic in the Mixed Mode Binary sequence. Furthermore, as noted above, several states have the same amount of phase shift. For example, STATE "1" and STATE "2" have the same amount of phase shift as noted by the position of points 806 and 808. The amount of phase shift changes from STATE "2" to STATE "3", but then remains the same in STATE "4".

Table 1 shows the switch positions associated with each state.

TABLE 1

| STATE | Switch 510a | Switch 514a | Switch 510b | Switch 514b | Switch 510c | Switch 514c |
|---|---|---|---|---|---|---|
| 0 | 0 | 0 | 0 | 0 | 0 | 0 |
| 1 | 1 | 0 | 0 | 0 | 0 | 0 |
| 2 | 0 | 1 | 0 | 0 | 0 | 0 |
| 3 | 1 | 1 | 0 | 0 | 0 | 0 |
| 4 | 0 | 0 | 1 | 0 | 0 | 0 |
| 5 | 1 | 0 | 1 | 0 | 0 | 0 |
| 6 | 0 | 1 | 1 | 0 | 0 | 0 |
| 7 | 1 | 1 | 1 | 0 | 0 | 0 |
| 8 | 0 | 0 | 0 | 1 | 0 | 0 |

TABLE 1-continued

| STATE | Switch 510a | Switch 514a | Switch 510b | Switch 514b | Switch 510c | Switch 514c |
|---|---|---|---|---|---|---|
| 9 | 1 | 0 | 0 | 1 | 0 | 0 |
| 10 | 0 | 1 | 0 | 1 | 0 | 0 |
| 11 | 1 | 1 | 0 | 1 | 0 | 0 |
| 12 | 0 | 0 | 1 | 1 | 0 | 0 |
| 13 | 1 | 0 | 1 | 1 | 0 | 0 |
| 14 | 0 | 1 | 1 | 1 | 0 | 0 |
| 15 | 1 | 1 | 1 | 1 | 0 | 0 |
| 16 | 0 | 0 | 0 | 0 | 1 | 0 |
| 17 | 1 | 0 | 0 | 0 | 1 | 0 |
| 18 | 0 | 1 | 0 | 0 | 1 | 0 |
| 19 | 1 | 1 | 0 | 0 | 1 | 0 |
| 20 | 0 | 0 | 1 | 0 | 1 | 0 |
| 21 | 1 | 0 | 1 | 0 | 1 | 0 |
| 22 | 0 | 1 | 1 | 0 | 1 | 0 |
| 23 | 1 | 1 | 1 | 0 | 1 | 0 |
| 24 | 0 | 0 | 0 | 1 | 1 | 0 |
| 25 | 1 | 0 | 0 | 1 | 1 | 0 |
| 26 | 0 | 1 | 0 | 1 | 1 | 0 |
| 27 | 1 | 1 | 0 | 1 | 1 | 0 |
| 28 | 0 | 0 | 1 | 1 | 1 | 0 |
| 29 | 1 | 0 | 1 | 1 | 1 | 0 |
| 30 | 0 | 1 | 1 | 1 | 1 | 0 |
| 31 | 1 | 1 | 1 | 1 | 1 | 0 |
| 32 | 0 | 0 | 0 | 0 | 0 | 1 |
| 33 | 1 | 0 | 0 | 0 | 0 | 1 |
| 34 | 0 | 1 | 0 | 0 | 0 | 1 |
| . | . | . | . | . | . | . |
| . | . | . | . | . | . | . |
| . | . | . | . | . | . | . |
| 63 | 1 | 1 | 1 | 1 | 1 | 1 |

A "1" in Table 1 indicates that the switch is activated. A "0" indicates that the switch is deactivated. For example, in STATE 28, switches 510a, 514a, 514c are deactivated and switches 510b, 514b, 510c are active. As can be seen from point 810, in STATE 28, the phase shift is approximately −5.8 degrees and the return loss is approximately −25 dB.

Figure 9:
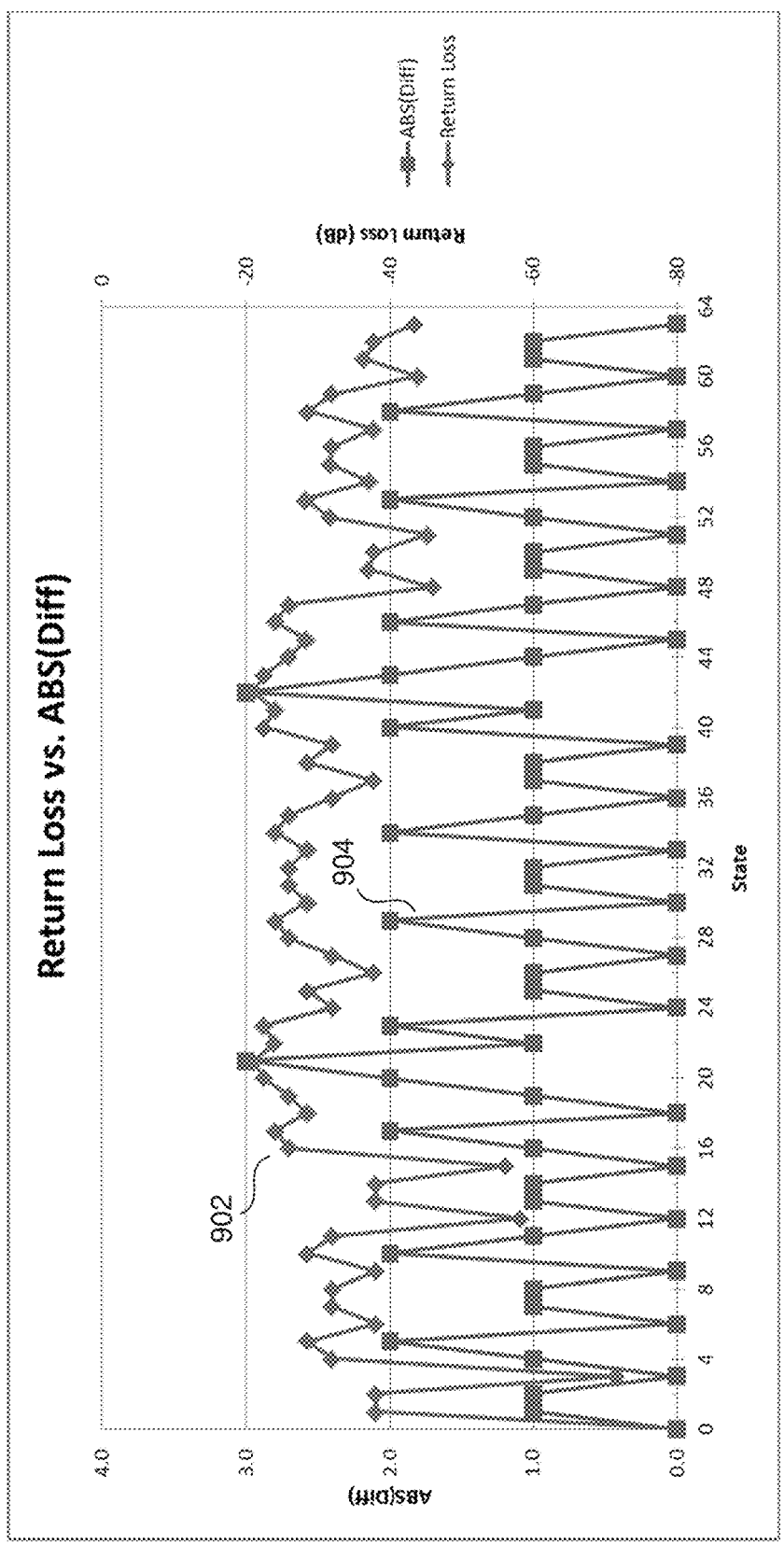
FIG. 9 is a graph showing the relationship between return loss, STATE and (ABS(diff)).

FIG. 9 is a graph showing the relationship between return loss, STATE and (ABS(diff)), where "diff" represents the number of ground switches that are active minus the number of bypass switches that are active and ABS("diff") indicates the absolute value of "diff". A first curve 904 shows ABS (diff) for each state. A second curve 902 shows the return loss for each STATE. The graph of FIG. 9 can be used to select the state with the best return loss when more than one state provides the same phase shift.

Figure 10:
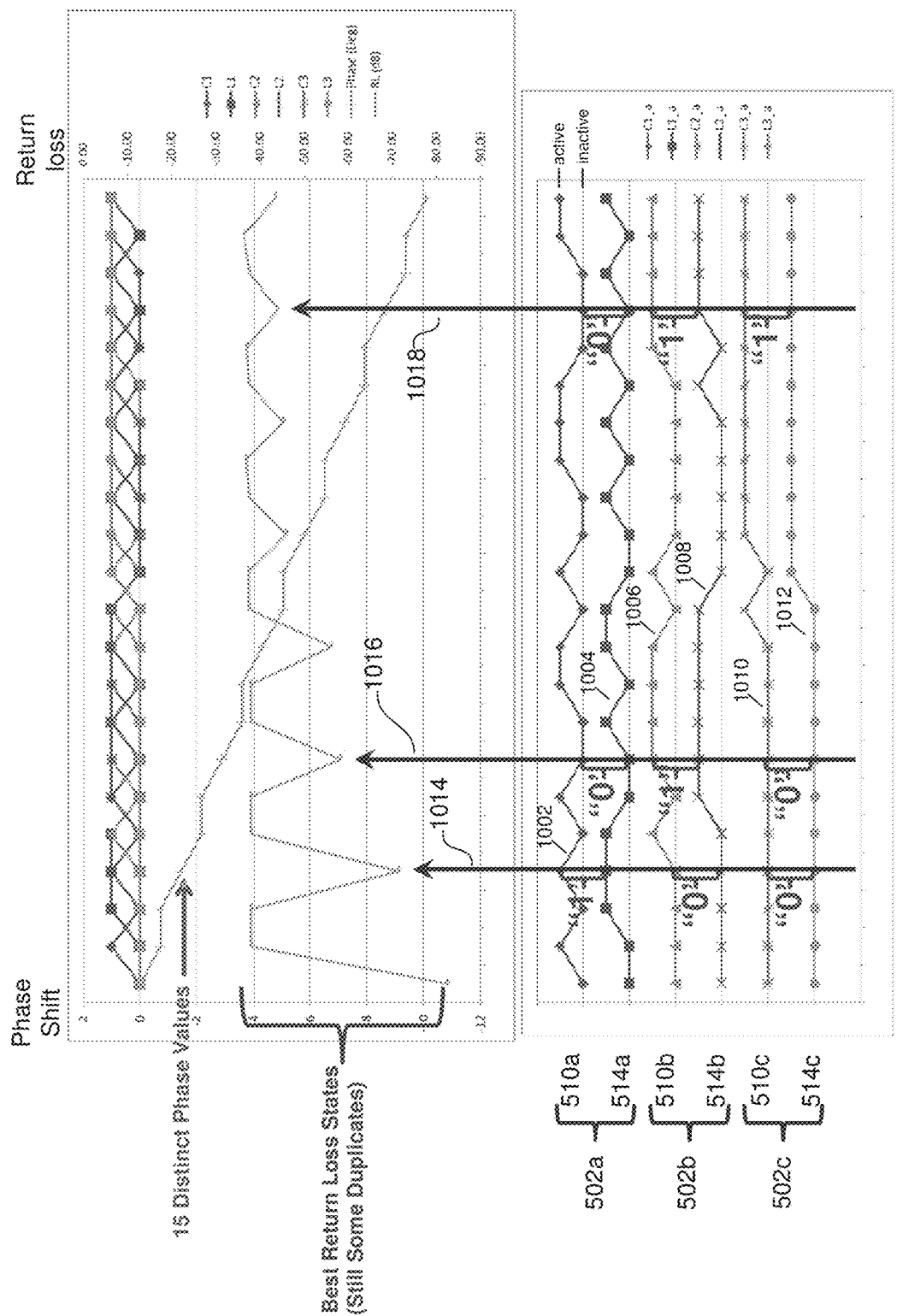
FIG. 10 further illustrates that there are 15 distinct phase shift states.

FIG. 10 illustrates that there are 15 distinct states. A first curve 1002 indicates the whether the switch 510a is active or inactive. Similarly, curves 1004, 1006, 1008, 1010, 1012 indicated the state of the other five switches 514a, 510b, 514b, 510c, 514c. The arrow 1014 indicates that in STATE "3" (i.e., with the switches 510a and 514a active and all others inactive) the return loss is relatively low. Similarly, the arrow 1016 indicates that in STATE "12" (i.e., with the switches 510b and 514b active and all others inactive) the return loss is relatively low. A third arrow 1018 indicates that in STATE "60" ((i.e., with the switches 510a and 514a inactive and all others active) the return loss is relatively low. It should be noted that the 22 states shown in FIG. 10 are selected from among the 64 possible states. These particular states have better return loss than the other states that are not shown. Note that there are only 15 unique phase shifts represented by the 22 states shown. However, the magnitude of the return loss in 14 of the states is the same, making it unnecessary to distinguish between them. The 42 states that are not shown have phase shifts that are equal to the phase shift of one of the states that is shown, and also have a return loss that is greater than the return loss of at least one state having a phase shift of the same magnitude. The results in FIG. 10 are ordered according to Phase Shift (i.e., they are not shown sequentially by State).

In the Component Level Binary sequence, each of the six reactive element 508a, 512a, 508b, 512b, 508c, 512c have a value that is binary weighted with respect to the other reactive elements. That is, inductor 512c has twice the reactance magnitude of capacitor 508c, which has twice the reactance magnitude of inductor 514b, which has twice the reactance magnitude of capacitor 508b, etc. Each of the switches 510a, 514a, 510b, 514b, 510c, 514c can be activated independently. Accordingly, the Phase Shift Control interface 520 can select from 64 unique phase shifts. The return loss is higher for the Component Level Binary sequence. Nonetheless, there may be circumstances when the benefits of having a relatively large number of small phase shift steps outweigh the disadvantages of a higher return loss (i.e., poor impedance match for some states).

Figure 11:
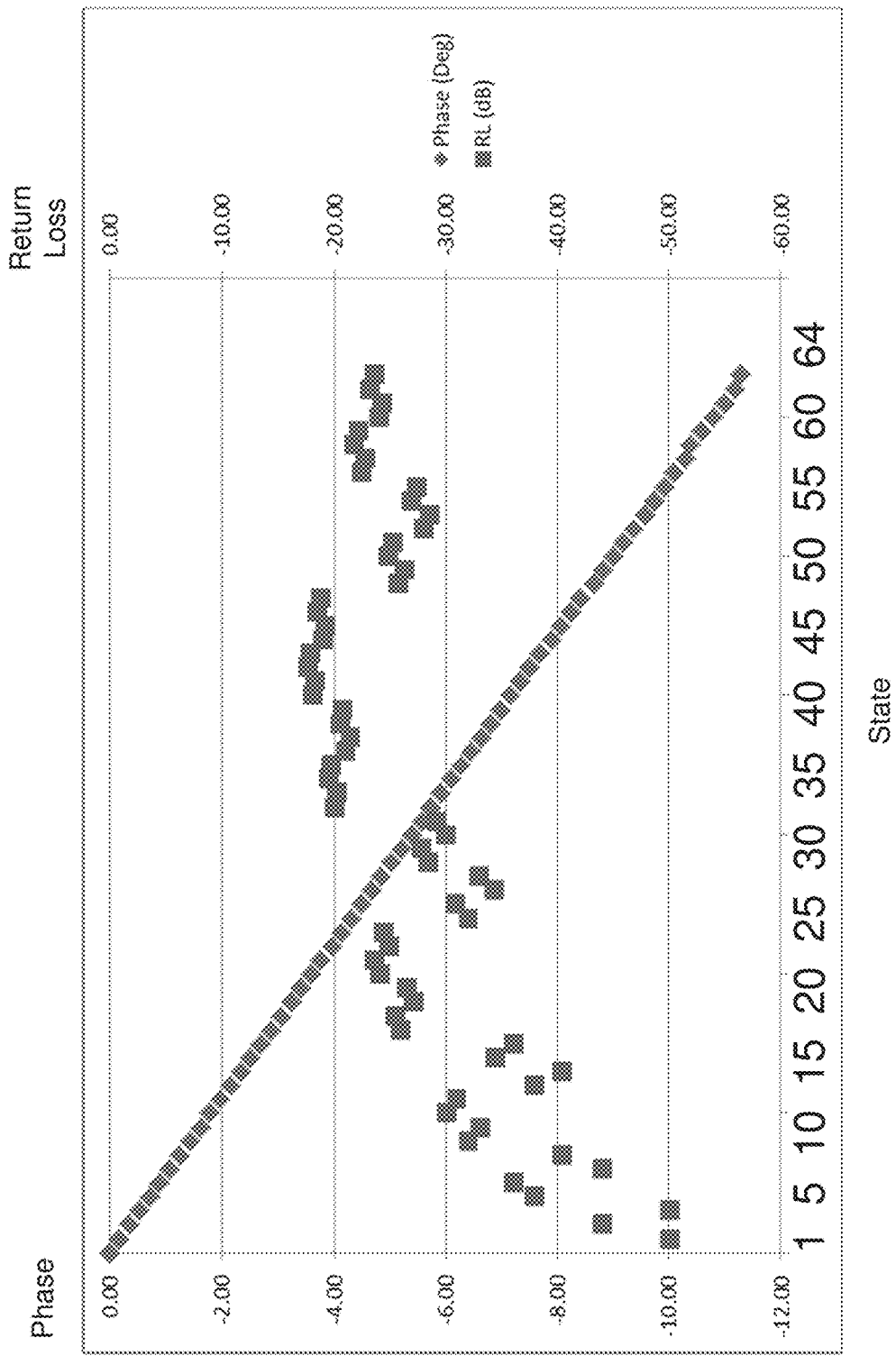
FIG. 11 is a plot of the phase shift and return loss for each of the 64 states of the Component Level Binary sequence.

FIG. 11 is a plot of the phase shift and return loss for each of the 64 states of the Component Level Binary sequence.

In some embodiments in which the elements have equal weight, each reactive component imparts a one degree phase shift when the associated switch 510, 514 is active. In yet another embodiment in which the reactive components have equal weight, each component imparts a quarter of a degree of phase shift when active. However, it will be understood that the amount of phase shift imposed by each step can vary depending upon the implementation.

Figure 12:
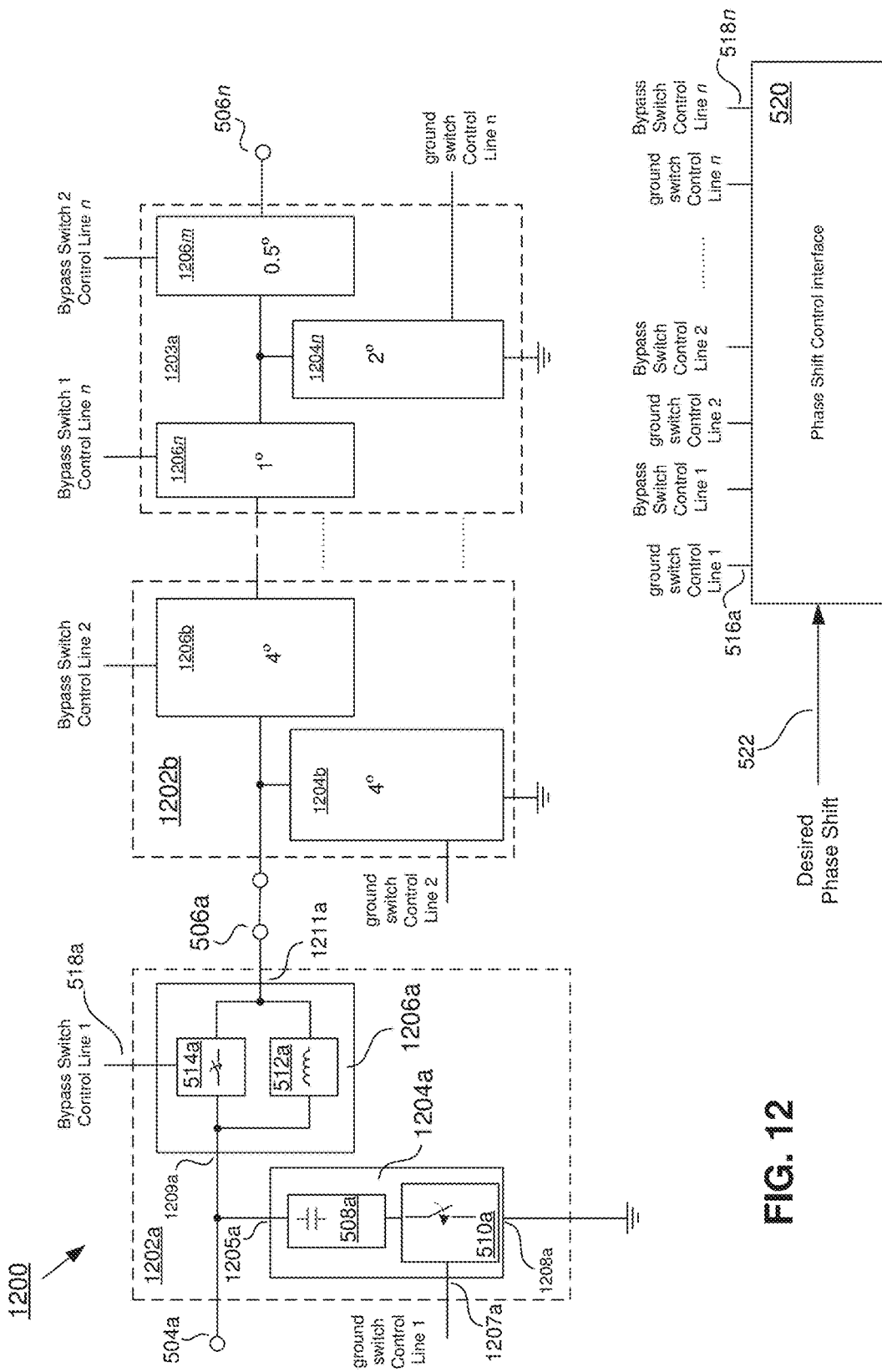
FIG. 12 is an illustration of a self-matching phase shifter in which two phase shifter element each have a shunt element including a capacitor in series with a ground switch.

FIG. 12 is an illustration of a self-matching phase shifter 1200 in which two phase shifter element 1202a, 1202b each have a shunt element 1204a including a capacitor 508a in series with a ground switch 510a, similar to the configuration shown in FIG. 5. In other embodiments, more than two such phase shifter elements 1202 may be provided. The shunt element 1204a has three terminals 1205a, 1207a, 1208a. The first terminal 1205a is coupled to a transmission line from the RF input port 504a of the phase shifter element 1202a. The second terminal 1208a is coupled to ground. The third terminal 1207a of the shunt element 1204a is coupled to the phase shift control interface 520 to control the ground switch 510a.

A first terminal 1209a of a series element 1206a within the phase shifter element 1202a is coupled to the input port 504a of the phase shifter element 1202a and to the first terminal of the shunt element 1204a. A second terminal 1211a of the series element 1206a is coupled to the output port 506a of the phase shifter element 1202a. A third terminal 513a of the series element 1206a is coupled to the phase shift control interface 520 to control the bypass switch 514a. In some embodiments, several such phase shifter elements 1202a through 1202n are present in the self-matching phase shifter 1200.

In some embodiments, such as the one shown in FIG. 12, each of the shunt elements 1204 and each of the series elements 1206 are weighted using a thermometer weighting (i.e., the amount of phase shift resulting from activating any element is equal). In some embodiments, the elements can be activated to add a 4 degree phase shift. Therefore, for the self-matching phase shifter 1200 of FIG. 12, a phase shift can be added in increments of 4 degrees, up to a total of 16 degrees of phase shift. In addition, a binary type phase shift element 1203a is provided in the self-matching phase shifter 1200. The binary type phase shifter element 1203a includes a series element 1206n that is similar to the series elements 1206 in the phase shifter elements 1202a, 1202b. However, the binary type phase shifter element 1203a further includes a second series element 1206m. The two series elements 1206*n*, 1206*m* and the one shunt element 1204*n* have binary weights. For example, in some embodiments, the first series element 1206*n* provides a phase shift of 1 degree when active. The second series element 1206*m* provides a phase shift of 0.5 degrees when active. The shunt element 1204*n* provides a phase shift of 2 degrees when active. Therefore, the three elements 1206*n*, 1206*m*, 1204*n* allow binary combinations to make it possible to get steps of 0.5 degrees from 0 through 20 degrees by using combinations of series and shunt elements 1204, 1206 within each of the phase shift elements 1202*a*, 1202*b*, 1203*a*.

Figure 13:
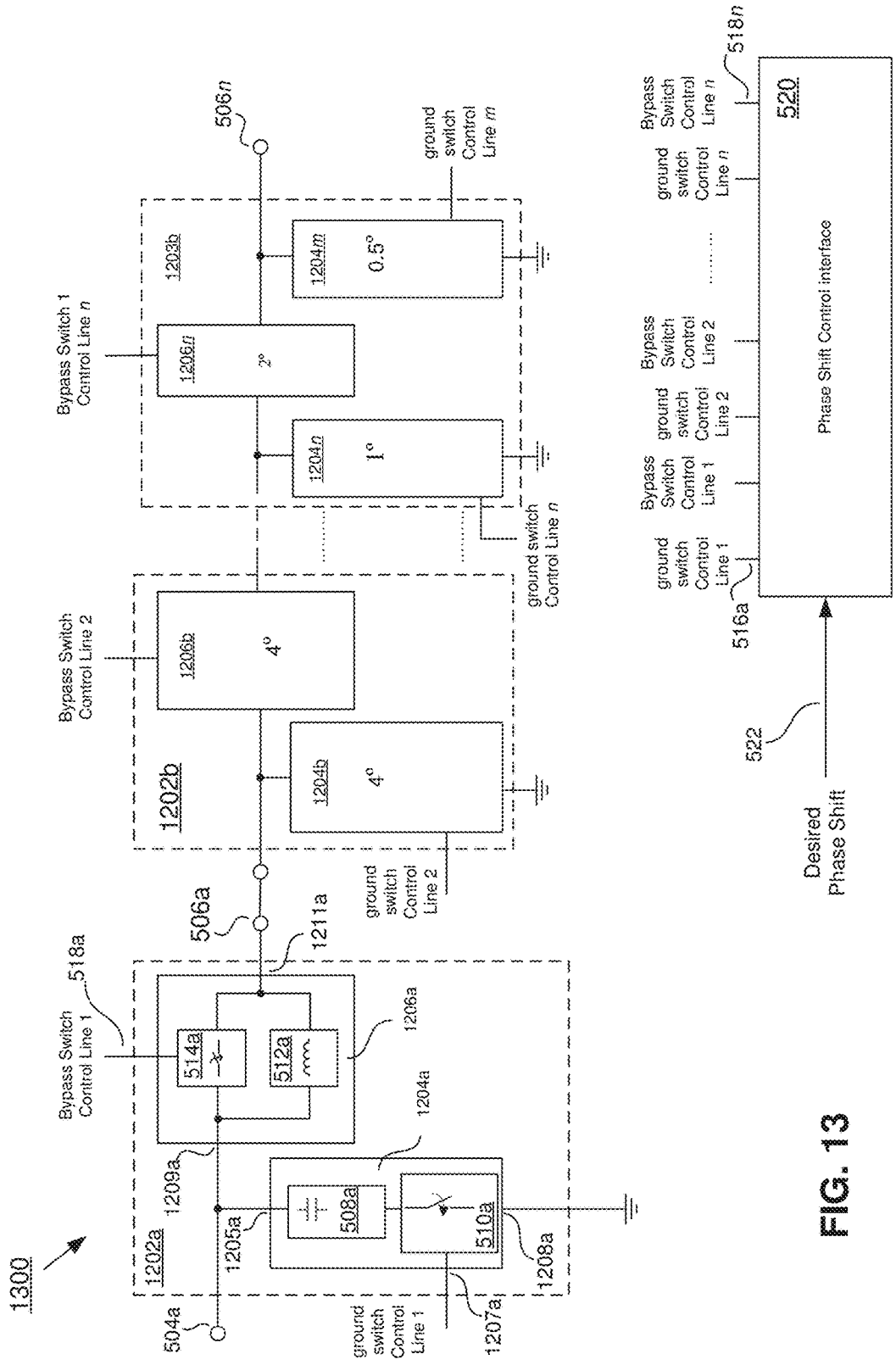
FIG. 13 is an illustration of another embodiment of a self-matching phase shifter in which a binary type phase shifter element includes two shunt elements and one series element.

FIG. 13 is an illustration of another embodiment of a self-matching phase shifter 1300 in which a binary type phase shifter element 1203*b* includes two shunt elements 1204*n*, 1204*m* and one series element 1206*n*. The first shunt element 1204*n* is capable of imposing a 1 degree phase shift when active. The second shunt element 1204*m* is capable of imposing a 0.5 degree phase shift when active. The series element 1206*n* is capable of imposing a 2 degree phase shift when active. Accordingly, by activating combinations of the series and shunt elements 1204, 1206 of each of the phase shifter elements 1202, 1203*b*, a phase shift in the range of 0 to 20 degrees can be provided by the self-matching phase shifter 1300.

In yet another embodiment of the self-matching phase shifter 1200, the binary type phase shifter element 1203 can be coupled between two thermometer type phase shifter elements 1202. Furthermore, in other embodiments, the values of the series and shunt elements 1204, 1206, can be set in any combination of thermometer type and binary type phase shift weightings. In other embodiments, the shunt elements can use inductive reactance to effect the phase shift and the series elements can use capacitive reactance to effect the phase shift. As noted above with regard to the embodiment show in FIG. 6, doing so would provide a self-matching phase shifter 1200 more suited to use with high frequencies (e.g., frequencies above the resonant frequency of the combination of the capacitive and inductive reactance within one phase shift element).

The phase shift control interface 520 can be a programmable device, such as a microprocessor. Alternatively, the phase shift control interface 520 can be a state machine or programmable logic array. Still further, the phase shift control interface 520 can be implemented using discrete hardware components. In some embodiments, the phase shift control interface 520 is simply a buffer or switch driver. In yet other embodiments, the switches 510, 514 may be capable of accepting control signals from a source external to the self-matching phase shifter 500. In some such cases, an external source may directly provide the signals on the control lines 516, 518, negating the need for a phase shift control interface 520.

Figure 14:
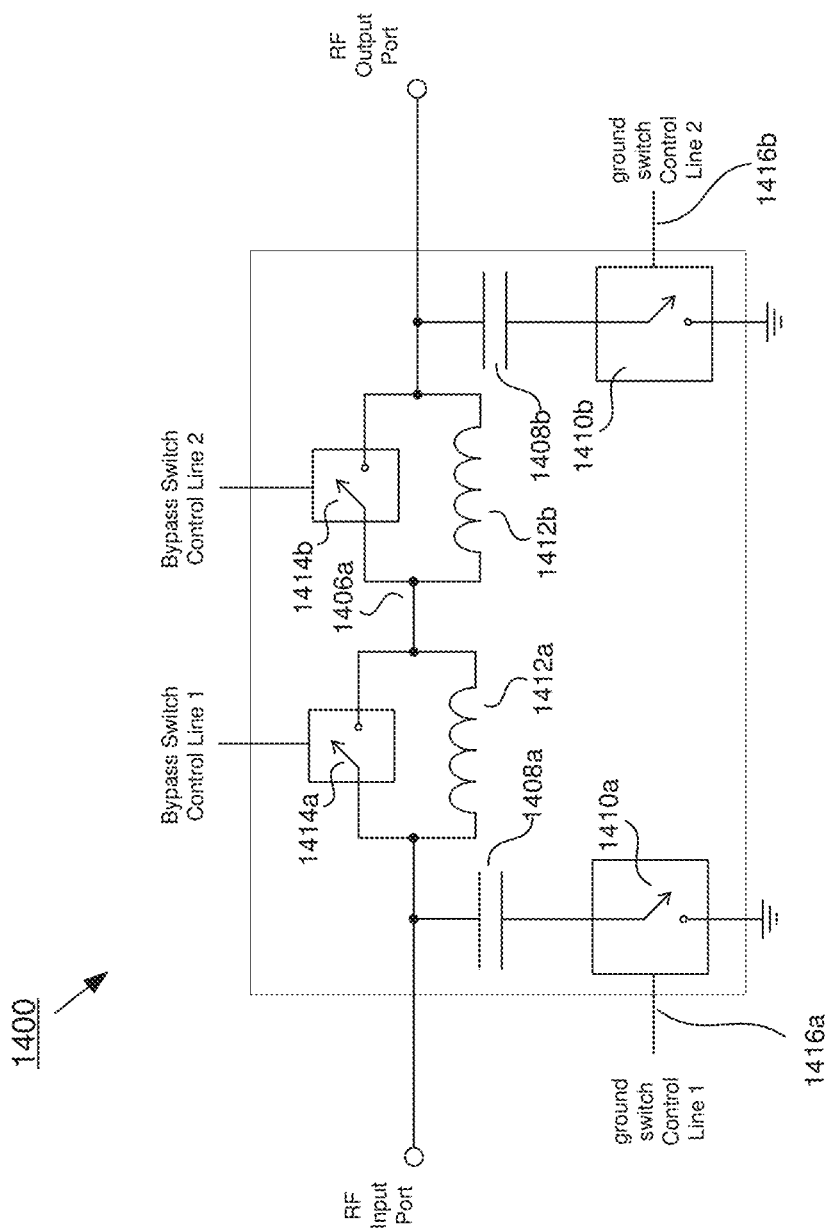
FIG. 14 is an illustration of an alternative phase shifter element having a "Pi" configuration.

FIG. 14 is an illustration of an alternative phase shifter element 1400 having a "Pi" configuration. The phase shifter element 1400 has four reactive components (two capacitive elements 1408*a*, 1408*b*, such as capacitors, and two inductive elements 1412*a*, 1412*b*, such as inductors). Each reactive component 1408, 1412 is associated with a switch 1410, 1414. In the case of the phase shifter element 1400 shown in FIG. 14, the capacitive elements are coupled in series with ground switches 1410*a*, 1410*b* and the inductive elements 1412*a*, 1412*b* are coupled in parallel with bypass switches 1414*a*, 1414*b*. The bypass switches 1414*a*, 1414*b* are opened and closed in response to bypass switch control signals coupled to the bypass switches 1414*a*, 1414*b* on bypass switch control lines 1, 2. The ground switches 1410*a*, 1410*b* are opened and closed in response to ground switch control signals coupled to the ground switches 1410*a*, 1410*b* on ground switch control lines 1, 2. As noted with regard to the phase shifter elements show in previous figures, such as FIG. 5, in some embodiments, the switch control signals are generated by a phase shift control interface (not shown in FIG. 14 for the sake of simplicity). In the Pi configuration of the phase shifter element 1400, one capacitive element 1408*a* and an associated ground switch 1410*a* are coupled in series between the input of the phase shifter element 1400 and ground. The second capacitive element 1408*b* and associated ground switch 1410*a* are coupled in series between the output of the phase shifter element 1400 and ground. The parallel pair including first inductive element 1412*a* and the associated bypass switch 1414*a* is coupled in series with the parallel pair including the second inductive element 1412*b* and associated bypass switch 1414*b*, making the circuit configuration look similar to the Greek letter Pi.

Figure 15:
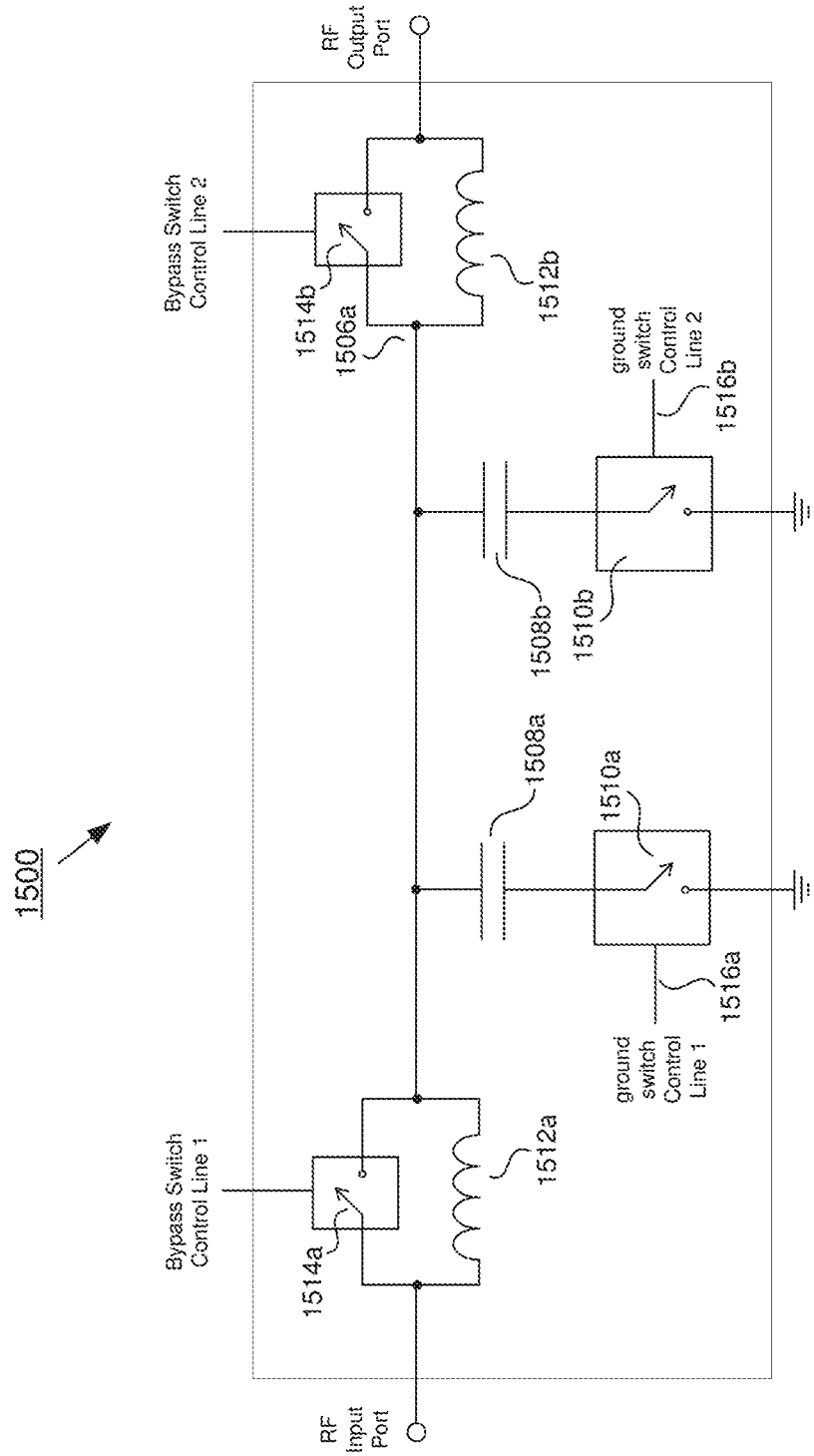
FIG. 15 is an illustration of an alternative phase shifter element having a "T" configuration.

FIG. 15 is an illustration of an alternative phase shifter element 1500 having a "T" configuration. The phase shifter element 1500 has four reactive components (two capacitive elements 1508*a*, 1508*b*, such as capacitors, and two inductive elements 1512*a*, 1512*b*, such as inductors). Each reactive component 1508, 1512 is associated with a switch 1510, 1514. In the case of the phase shifter element 1500 shown in FIG. 15, the capacitive elements are coupled in series with ground switches 1510*a*, 1510*b* and the inductive elements 1512*a*, 1512*b* are coupled in parallel with bypass switches 1514*a*, 1514*b*. The bypass switches 1514*a*, 1514*b* are opened and closed in response to bypass switch control signals coupled to the bypass switches 1514*a*, 1514*b* on bypass switch control lines 1, 2. The ground switches 1510*a*, 1510*b* are opened and closed in response to ground switch control signals coupled to the ground switches 1510*a*, 1510*b* on ground switch control lines 1, 2. As noted with regard to the phase shifter elements show in previous figures, such as FIG. 5, in some embodiments, the switch control signals are generated by a phase shift control interface (not shown in FIG. 15 for the sake of simplicity). In the T configuration of the phase shifter element 1500, the first inductive element 1512*a* and the associated bypass switch 1514*a* are coupled as a parallel pair. One end of the parallel pair coupled to the input of the phase shifter element 1500. The second end of the parallel pair is coupled to a first end of each of the first and second capacitive element 1408*a*, 1408*b*. The second end of each of the capacitive elements 1408*a*, 1408*b* is coupled to the ground switch 1410*a*, 1410*b* associated with each capacitive element 1408*a*, 1408*b*, respectively. A second parallel pair including the second inductive element 1512*b* and the associated bypass switch 1514*b* are coupled between the second end of the first parallel pair and the output of the phase shifter element 1500, making the configuration resemble the letter "T".

Figure 16:
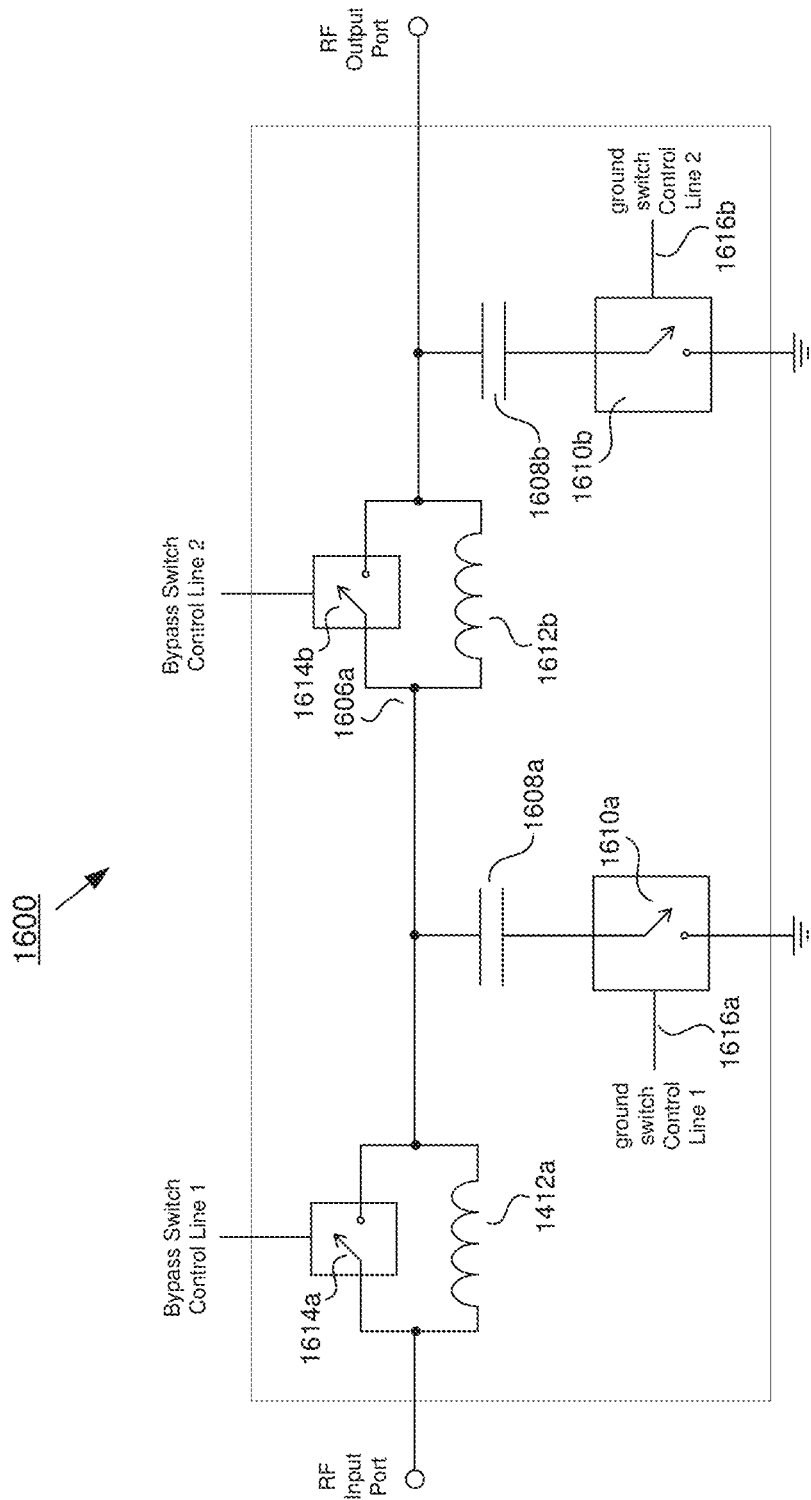
FIG. 16 is an illustration of an alternative phase shifter element having an "L" configuration.

FIG. 16 is an illustration of an alternative phase shifter element 1600 having an "L" configuration. The phase shifter element 1600 has four reactive components (two capacitive elements 1608*a*, 1608*b*, such as capacitors, and two inductive elements 1612*a*, 1612*b*, such as inductors). Each reactive component 1608, 1612 is associated with a switch 1610, 1614. In the case of the phase shifter element 1600 shown in FIG. 16, the capacitive elements are coupled in series with ground switches 1610*a*, 1610*b* and each inductive element 1612*a*, 1612*b* is coupled in parallel with an associated bypass switch 1614*a*, 1614*b*. The bypass switches 1614*a*, 1614*b* are opened and closed in response to bypass switch control signals coupled to the bypass switches 1614*a*, 1614*b* on bypass switch control lines 1, 2. The ground switches 1610*a*, 1610*b* are opened and closed in response to ground switch control signals coupled to the ground switches 1610a, 1610b on ground switch control lines 1, 2. As noted with regard to the phase shifter elements show in previous figures, such as FIG. 5, in some embodiments, the switch control signals are generated by a phase shift control interface (not shown in FIG. 16 for the sake of simplicity). In the L configuration, each capacitive element 1608a, 1608b and the associated ground switch 1610a, 1610b is separated by one of the parallel pairs that include one inductive element 1612a, 1612b and an associated bypass switch 1614a, 1614b. In the L configuration shown in FIG. 16, a first end of the first parallel pair 1612a, 1614a is coupled to the input of the phase shifter element 1600. The second end of the first parallel pair 1612a, 1614b is coupled to both the first end of the second parallel pair 1612b, 1614b and to one end of the first capacitive element 1608a. The second end of the second parallel pair 1612b, 1614b is coupled to the output of the phase shifter element 1600 and to one end of the second capacitive element 1608b. The second end of each of the capacitive elements 1608a, 1608b is coupled to the respective associated ground switch 1610a, 1610b. Each ground switch 1610a, 1610b provides a path to ground when closed.

Each of these three configurations (i.e., "Pi", "T" and "L") provides essentially the same phase shift when the capacitance of the capacitive elements 1408a, 1408b is the same and when the inductance of the inductive elements 1410a, 1410b is the same. However, the return loss when coupled to a circuit with a particular characteristic impedance will differ for each configuration.

Tables 2, 3 and 4 show the amount of the phase shift and the return loss associated with the respective phase shift element when coupled to a circuit having a characteristic impedance of 50 Ohms, wherein each of the three configurations have components with the values noted for each of three different cases. In each case, the return loss and amount of phase shift are noted for the state in which all four reactive components are active (i.e., bypass switches 1414a, 1414b are open and ground switches 1410a, 1410b are closed).

TABLE 2

CASE 1

| | | | | Phase (deg) | Return Loss (dB) |
|---|---|---|---|---|---|
| Characteristic Impedance | 50 | Ohms | | | |
| Inductance | 250 | pH | Pi | −7.205 | −46.1 |
| Capacitance | 0.1 | pF | T | −7.205 | −46.0 |
| Frequency | 2 | GHz | L | −7.205 | −58.6 |
| Resonant Frequency | 200 | GHz | | | |

TABLE 3

CASE 2

| | | | | Phase (deg) | Return Loss (dB) |
|---|---|---|---|---|---|
| Characteristic Impedance | 50 | Ohms | | | |
| Inductance | 1000 | pH | Pi | −29.12 | −37.0 |
| Capacitance | 0.4 | pF | T | −29.13 | −34.5 |
| Frequency | 2 | GHz | L | −29.08 | −24.9 |
| Resonant Frequency | 50 | GHz | | | |

TABLE 4

CASE 3

| | | | | Phase (deg) | Return Loss (dB) |
|---|---|---|---|---|---|
| Characteristic Impedance | 50 | Ohms | | | |
| Inductance | 100 | pH | Pi | −2.88 | −46.1 |
| Capacitance | 0.04 | pF | T | −2.88 | −46.1 |
| Frequency | 2 | GHz | L | −2.88 | −47.2 |
| Resonant Frequency | 500 | GHz | | | |

From TABLE 2, it can be seen that for inductive elements 1412a, 1412b having an inductance of 250 picohenrys, and capacitive elements 1408a, 1408b having a capacitance of 0.1 picofarad and used in a circuit having a characteristic impedance of 50 Ohms, the resonant frequency is 200 GHz. When operating at a frequency of 2 GHz, the phase shifter element provides a phase shift of −7.205 degrees in each of the three configurations. However, the return loss of the L configuration is −58.6 dB, which is 12.6 dB below the T configuration and 12.5 dB below the Pi configuration.

For the values that are shown for case 2 in TABLE 3, the amount of phase shift provided by the phase shifter element is much greater, but the return loss for all three configurations is higher than for case 1. Furthermore, for case 2 as shown in TABLE 3, the L configuration has a higher return loss than the Pi or T configurations.

For case 3, the amount of phase shift provided by the phase shifter element in each configuration is smaller than in the other two cases. The return loss for each of the three configurations in similar, with the L configuration having 1.1 dB less return loss than the other two configurations. Accordingly, it can be seen that both the configuration and the values of capacitance and inductance have an impact. However, the most significant impact is a result of the values of capacitance and inductance selected. Furthermore, the particular states of the switches (i.e., which reactive components are active) will have a significant impact on the amount of phase shift provided and the amount of return loss.

Figure 17:
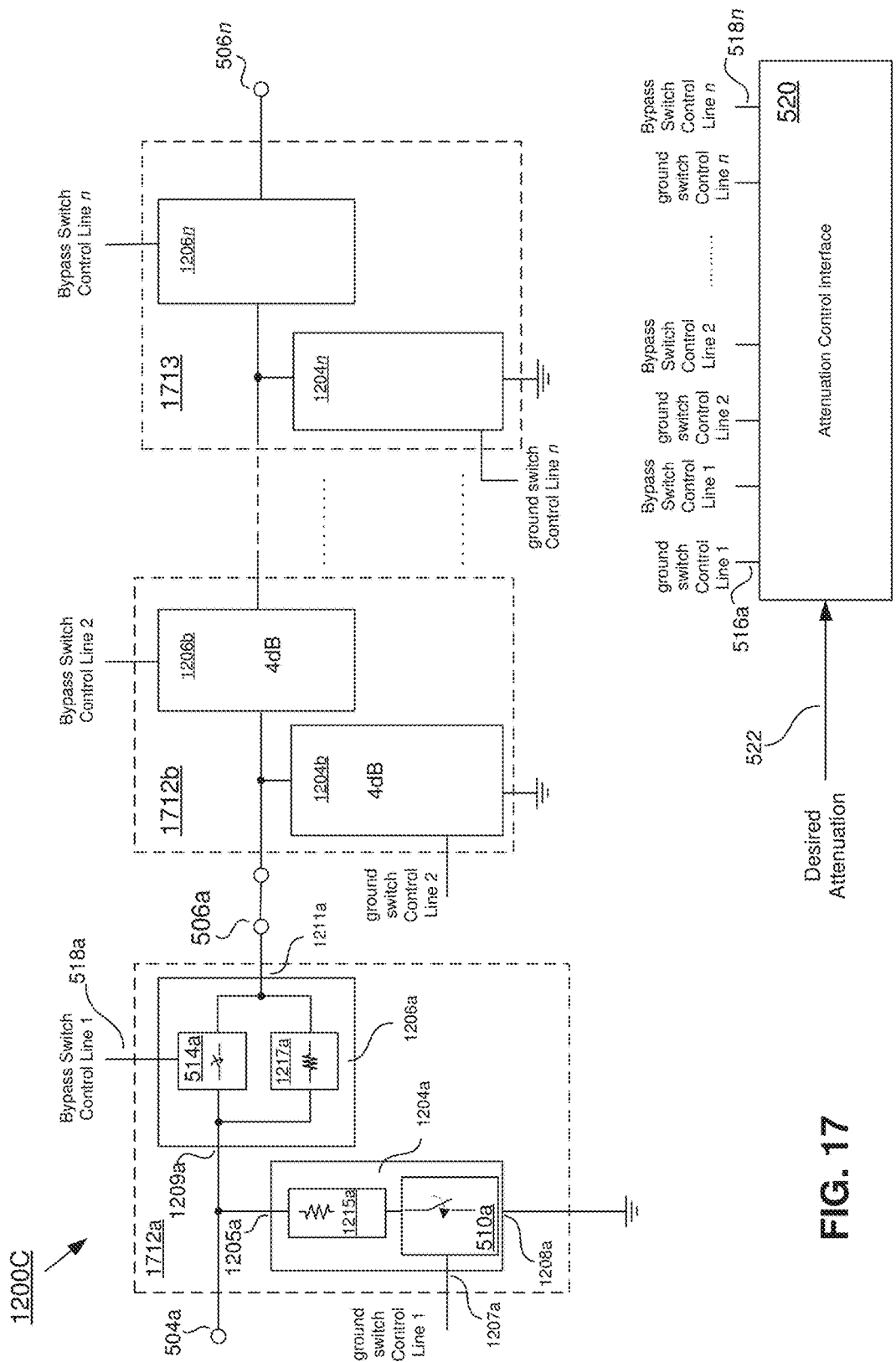
FIG. 17 is an illustration attenuator in accordance with an alternative embodiment in which attenuation elements, rather than phase shifter elements, are activated to select a desired signal attenuation rather than phase shift.

FIG. 17 is an illustration attenuator 1200C in accordance with an alternative embodiment in which attenuation elements 1712, 1713, rather than phase shifter elements 502 are activated to select a desired signal attenuation rather than phase shift. The shunt elements 1204a and series elements 1206 are resistive rather than reactive. Accordingly, activating the ground switch and the bypass switch causes additional attenuation to be imposed between the input port 504a and the output port 506n of the attenuator 1200C. That is, when activated, the attenuation elements 1712 impose an attenuation without altering the impedance match between the input port 504a of the attenuator 1200C and the output port 506n of the attenuator 1200C. Similar to the phase shifter 500 discussed above, the amount of resistance associated with each switch 510, 514 can be configured as either thermometer type attenuator weights in which the ratio of the shunt resistance to the series resistance results in the same amount of attenuation for each attenuation element 1712 that is activated. Alternatively, binary type attenuator weights or a combination of some thermometer type weights and some binary type weights can be used. For example, the attenuator element 1712a shown in FIG. 17 and the attenuator element 1712b through 1712n−1 are configured with thermometer type weights (the amount of attenuation added as each element 1712a through 1712n is activated is the same). Alternatively, some attenuator elements can be weighted with binary type weights (i.e., the amount of attenuation added when a second attenuator element is added is twice the amount added when a first attenuator element is activated; a third attenuator element adds twice the attenuation of the second attenuation element, and so on).

Figure 1:
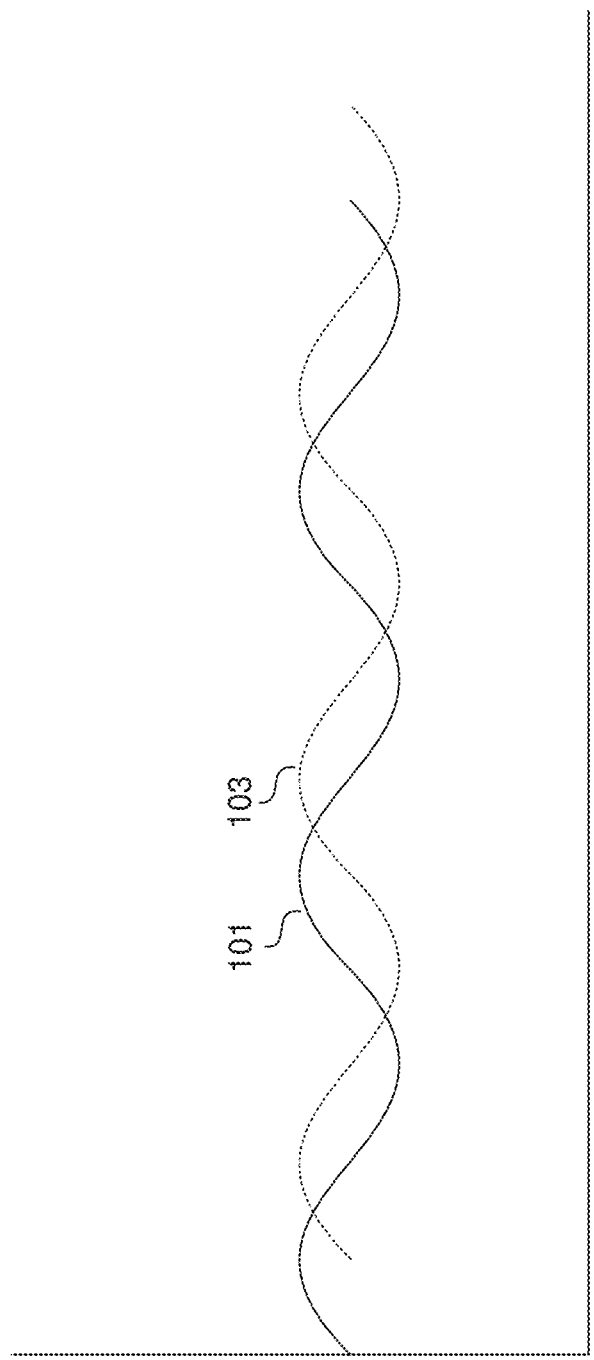
FIG. 1 shows a solid line following three periods of a first sine wave plotted with voltage in the vertical axis and time in the horizontal axis.
Figure 2:
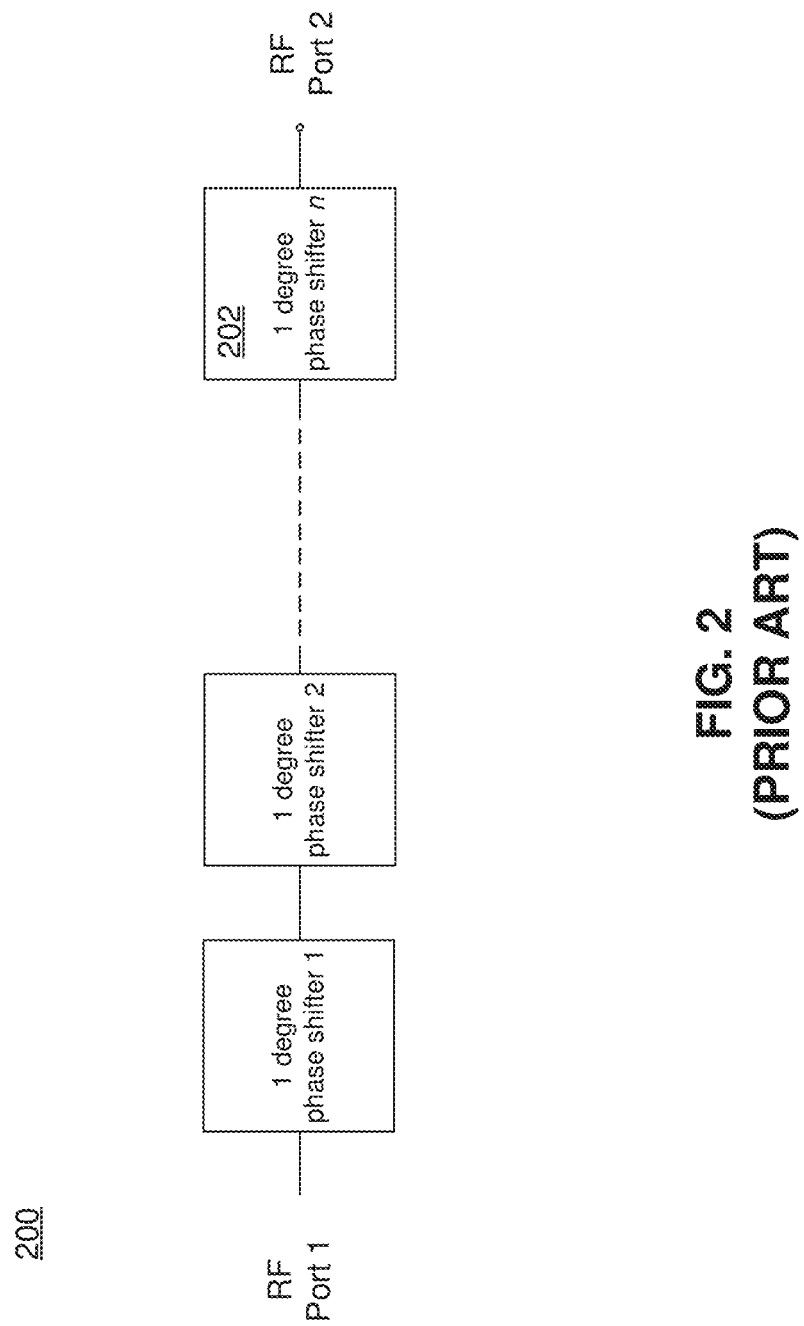
FIG. 2 is an illustration of one phase shifter in which the amount of the phase shift can be varied.
Figure 3:
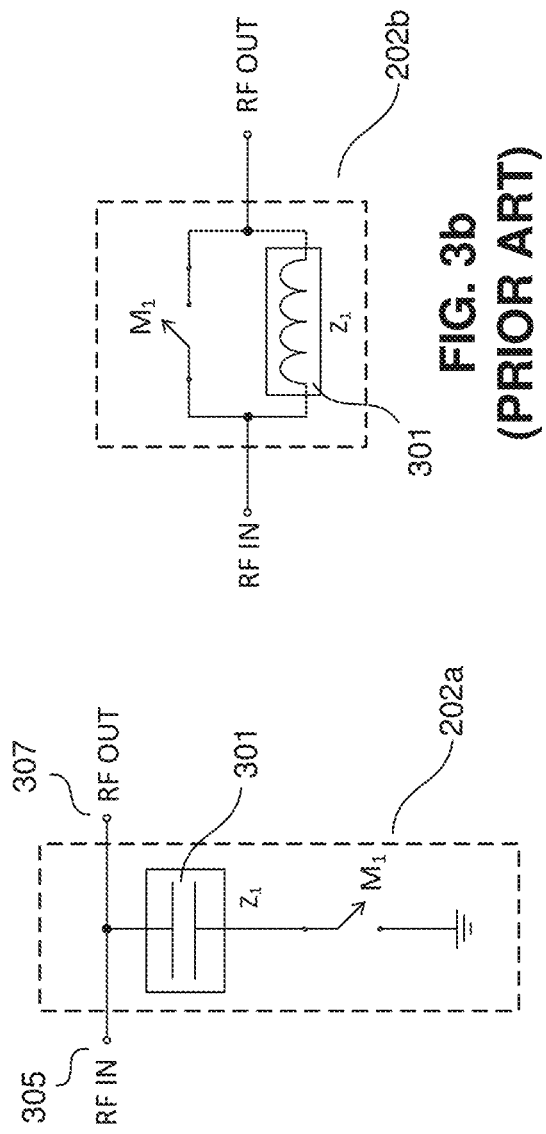
FIG. 3a and FIG. 3b illustrate two ways in which the incremental phase shifter elements of FIG. 2 can be implemented.
Figure 4:
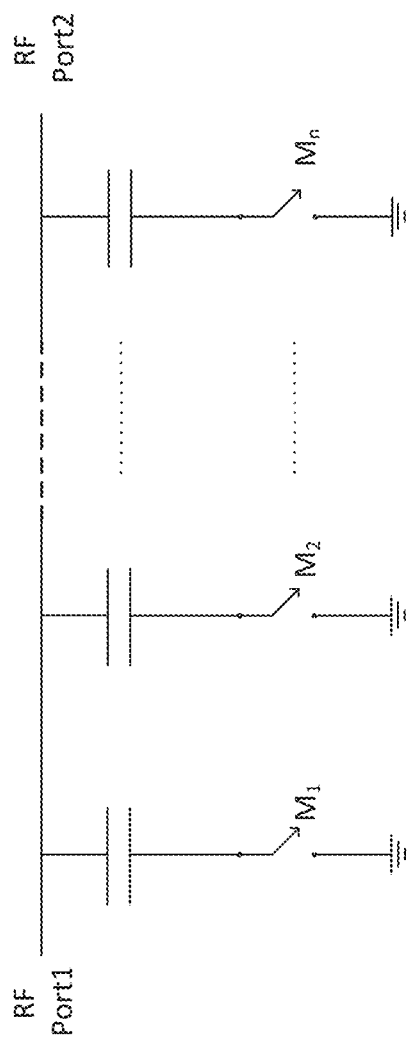
FIG. 4 is an illustration of a schematic of a capacitive variable phase shifter.
Figure 18:
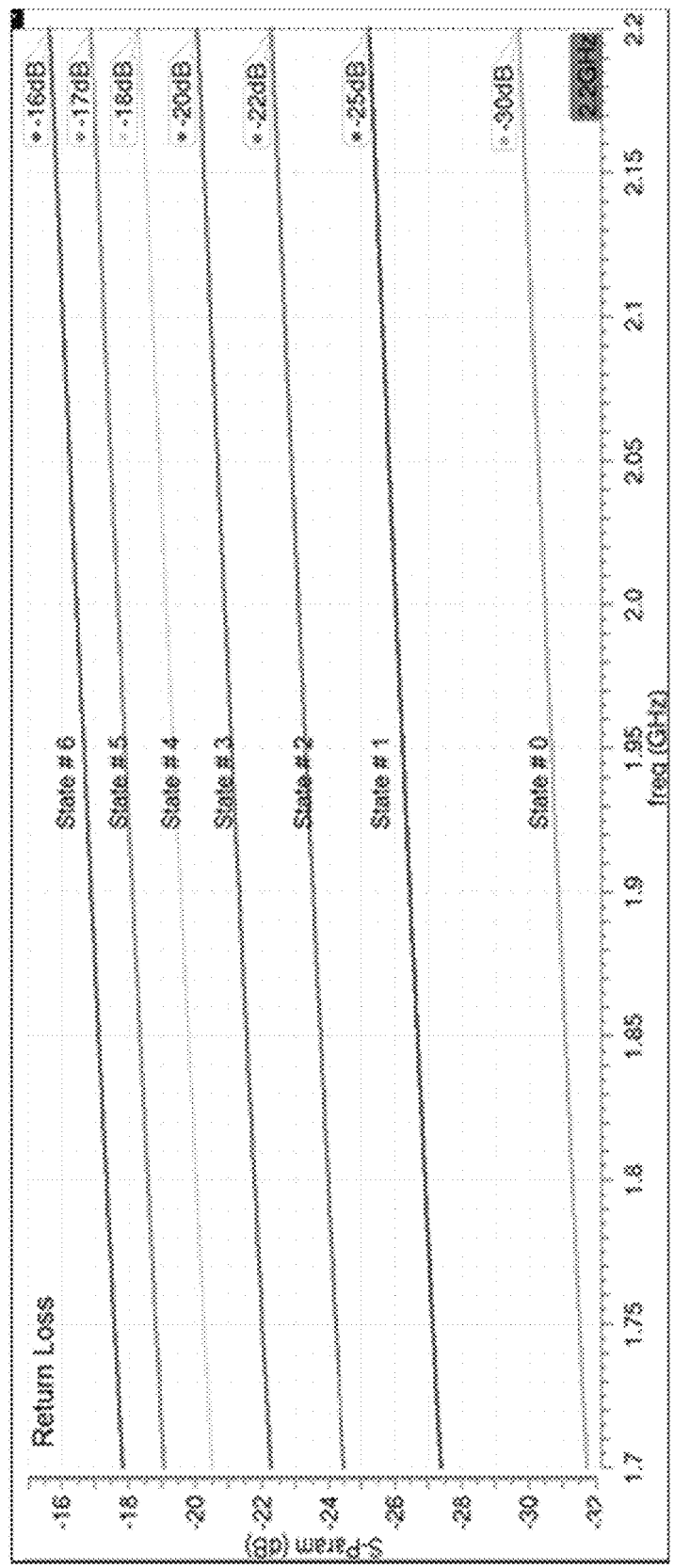
FIG. 18 is a plot of return loss versus frequency for a conventional thermometer controlled phase shifter.

FIG. 18 is a plot of the return loss versus frequency for a conventional thermometer controlled phase shifter 200 shown in FIG. 2. Curves are shown for seven states, zero through six. Each State is defined by a number of active elements. Accordingly, in State #3, three elements 202 (see FIG. 2) are active. All of the elements 202 are inactive in State #0. Each of six elements 202a-202f (see FIG. 3a) impart one degree of phase shift.

The curve of State #0 shows a return loss (value of "S-parameter") of approximately −32 dB at a frequency of 1.7 GHz. At 2.2 GHz, the return loss is −30 dB. Upon activating the second element 502b, the return loss at 1.7 GHz goes to approximately −27.5 dB and −25 dB at 2.2 GHz. By the time the sixth element 202g is activated, the return loss is approximately −18 dB at 1.7 GHz and only −16 dB at 2.2 GHz. Therefore, for a phase shift of just 6 degrees, the return loss degrades from −32 dB to −18 dB at the low end of the frequency spectrum and from −30 dB to −16 dB at the high end of the frequency spectrum.

Figure 19:
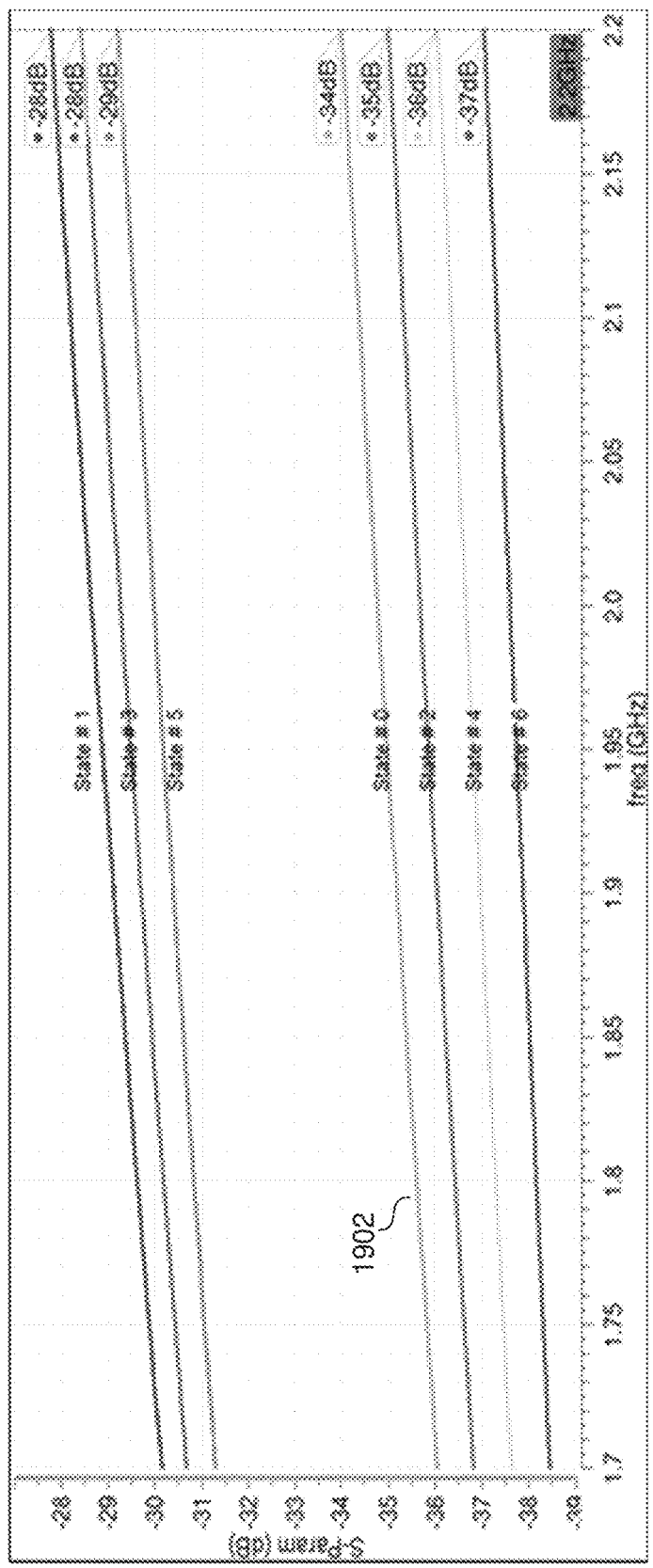
FIG. 19 shows the return loss curves for a self-matching phase shifter having three elements, each element having a ground switch and a bypass switch.

In contrast, FIG. 19 shows the return loss curves for the self-matching phase shifter 500 having three elements 502, each element 502 having a ground switch 510 and a bypass switch 514. The curves assume a thermometer type weighting configuration in which one additional switch 510, 514 is activated when increasing the phase shift to the next State. In State #0, all of the switches 510, 514 in each element 502 are inactive (i.e., the bypass switches 514 are closed and the ground switches 510 are open). As can be seen from the curve 1902, the return loss at 1.7 GHz is approximately −36 dB. The return loss is approximately −34 dB at 2.2 GHz. In State #1, a first ground switch 510a of a first element 502a is closed. The return loss increases to approximately −30 dB at 1.7 GHz and approximately −28 dB at 2.2 GHz in response to the addition of the shunt capacitor 508a being placed between the input port 504a and ground.

In State #2, the first bypass switch 514a is opened to place the inductor 512a in series with the signal path (i.e., the path from the input port 504a to the output port 506a). With each additional State, a capacitor 508 is first placed in shunt to ground followed in the next State by an inductor 512 being placed in series with the signal path. Any number of such States (i.e., additional elements 502) can be implemented. As noted above, one of the ground switches 510 can be closed followed by one of the bypass switches 514 being opened. However, it is also equally within the scope of the disclosed embodiments for the bypass switch 514 to be opened first, followed by the closing of one of the ground switches 510. Furthermore, while it seems to be logical for the ground switch 510 and bypass switch 514 of the same element 502 to be operated in adjacent steps, it is not necessary. That is, the ground switch of a first element 502a may be activated in Stage #1, followed by a bypass switch 514 of a different element 502b in Stage #2. In Stage #3, the bypass switch 514 of the first element 502a is then activated, followed in Stage #4 by the ground switch 510 of second element 502b.

Furthermore, in most embodiments, ensuring that the difference between the number of ground switches 510 that are active and the number of bypass switches 514 that active is never greater than 1 will typically result in the most desirable return loss performance (i.e., the best input and output impedance matching). However, it is possible that in some physical layouts, there might be a benefit to activating the switches in an order that results in some steps in which the difference between the number of active ground switches 510 and the number of active bypass switches 514 is greater than one.

In accordance with one embodiment of the disclosed method and apparatus, the switches 510, 514 can be manufactured in accordance with techniques provided in U.S. Pat. No. 6,804,502 (the "502 patent"), which is incorporated by reference herein, and disclosed in other related patents. Additional improvements in the performance of one or more of the switches 510, 514 can be attained by implementing the techniques provided in U.S. Pat. No. 7,910,993 (the "993 patent"), which is incorporated by reference herein, and disclosed in other related patents. Use of such high performance switches reduces the non-linearity of the switches and thus the adverse effects of such switches on the performance of the phase shifter 500. However, in many implementations, it may be possible to use switches that have performance characteristics (i.e., linearity, return loss, switching speed, ease of integration, etc.) that are not as good as the characteristics of switches made in accordance with the techniques disclosed in the '502 and '993 patents. Accordingly, each or some of the switches disclosed above can be implemented using by any combination of one or more transistors, including FETs, bipolar junction transistors (BJTs), or any other semiconductor switch. Alternatively, the switches can be implemented by electromechanical or MEMs (Micro-Electro-Mechanical Systems) technologies.

Methods

Figure 20:
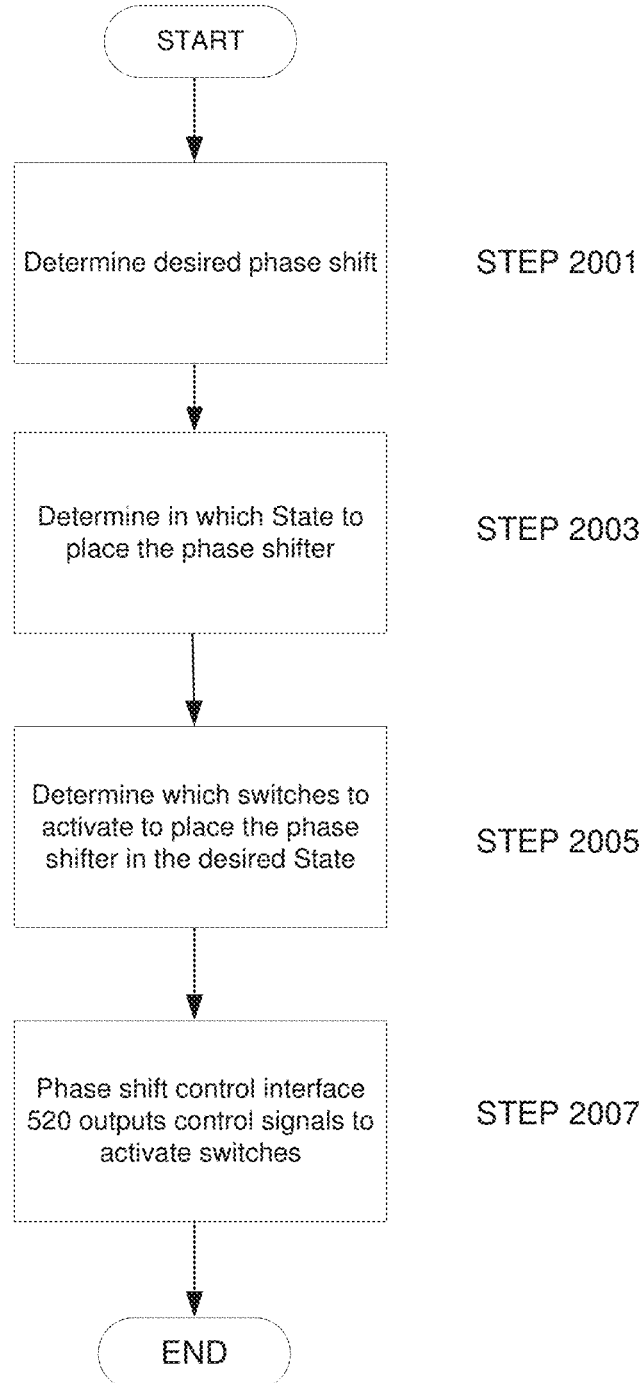
FIG. 20 is an illustration of a method in accordance with one embodiment for setting the phase shift imparted by the self-matching phase shifter.

FIG. 20 is an illustration of a method in accordance with one embodiment for setting the phase shift imparted by the self-matching phase shifter 500. In accordance with one embodiment, the amount of desired phase shift is determined by a user or external component [STEP 2001]. The amount of desired phase shift is communicated to the phase shift control interface 520. Based on the amount of phase shift desired and the step size of the phase shifter 500, the phase shift control interface 520 determines the particular State of the phase shifter [STEP 2003]. As noted above, each State is defined by the number of steps of phase shift imparted in that State. For example, if the desired amount of phase shift is 1.5 degrees and each step provides one half degree of phase shift, then the phase shifter 500 will need to be placed in State #3. Next, the phase shift control interface 520 determines which switches 510, 514 to activate in order to place the phase shifter 500 in the desired State [STEP 2005]. The phase shift control interface 520 then outputs signals on the appropriate switch control lines 516, 518 in order to activate the selected switches 510, 514 [STEP 2007].

Figure 21:
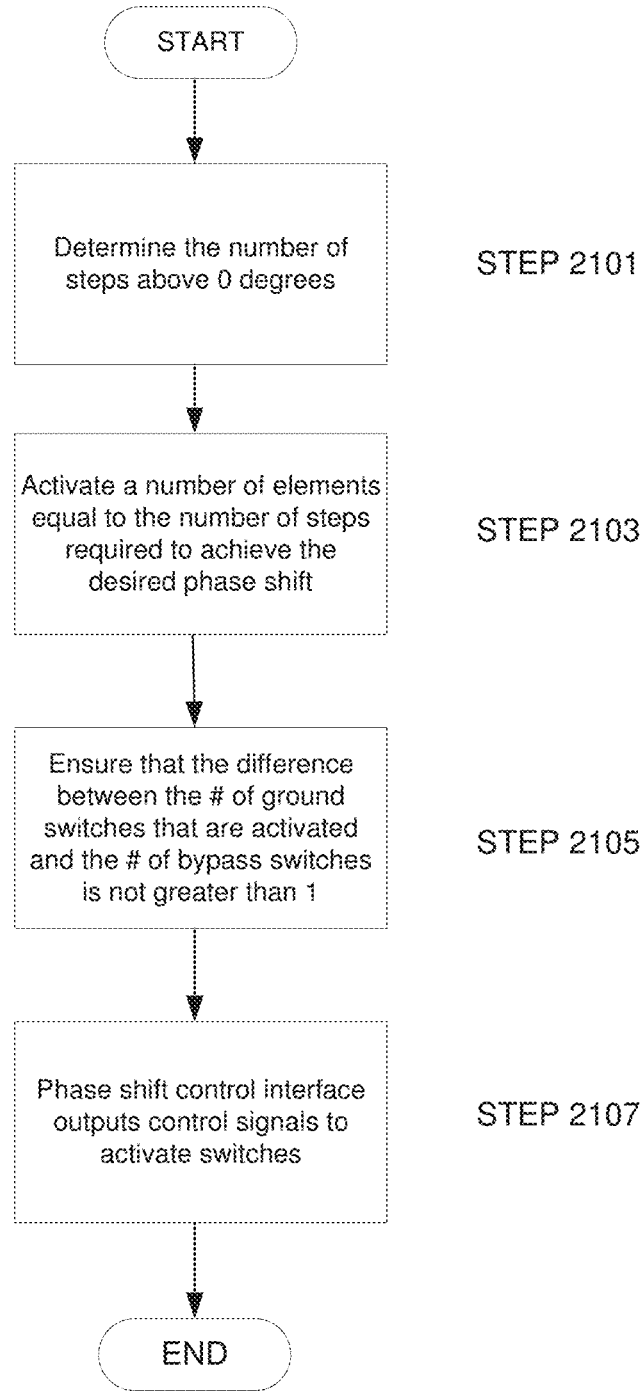
FIG. 21 is an illustration of a method for activating the switches of the elements in a thermometer configured self-matching phase shifter.

FIG. 21 is an illustration of one method for activating the switches 510, 514 of the elements 502 in a thermometer configured self-matching phase shifter 500. Initially, the phase shift control interface 520 determines the number of steps required to achieve the desired phase shift [STEP 2101]. In order to do so, the phase shift control interface 520 divides the desired phase shift by the step size. Accordingly, if the desired phase shift is 1.5 degrees and the step size if 0.5 degrees, then 1.5/0.5=3 steps are required to impart the desired phase shift. In some embodiments, three switches need to be activated to achieve the 1.5 degrees of phase shift [STEP 2103]. As noted above, in one embodiment, the phase shift control interface 520 selects which switches 510, 514 to activate in a manner that ensures that the difference between the number of ground switches 510 and the number of bypass switches 514 is not greater than 1 [STEP 2105]. In one such embodiment, the phase shift control interface 520 activates both switches in a first element 520 before activating the switches in a second element 520. Alternatively, as long as the difference between the number of ground switches 510 and the number of bypass switches 514 is not greater than 1, the particular switches that are activated can be based on other criteria, such as the physical layout within the elements 502 and the layout of the elements 520 within the phase shifter 500. In some embodiments, the State number indicates the number of steps of phase shift to be imparted. The number of active ground switches 510 is one greater than the number of active bypass switches 514 in odd numbered States. The number of active ground switches 510 and the number bypass switches 514 is equal for even numbered States. Alternatively, the number of active bypass switches 514 is one greater than the number of active ground switches 510 in odd numbered States. The number of active ground switches 510 and the number bypass switches 514 is equal for even numbered States.

In yet another embodiment, in some odd States, the number of active ground switches 510 is one greater than the number of active bypass switches 514, while in other odd States, the number of active bypass switches 514 is one greater than the number than the number of active ground switches 510. For example, in State #1, a first ground switch 510 is activated making the number of ground switches 510 one greater than the number of bypass switches 514; in State #2 a first bypass switch 514 is also activated, making the number of active ground switches 510 equal to the number of active bypass switches 514; in State #3, a second bypass switch 514 is activated making the number of active bypass switches 514 one greater than the number of active ground switches 510, etc.

Figure 22:
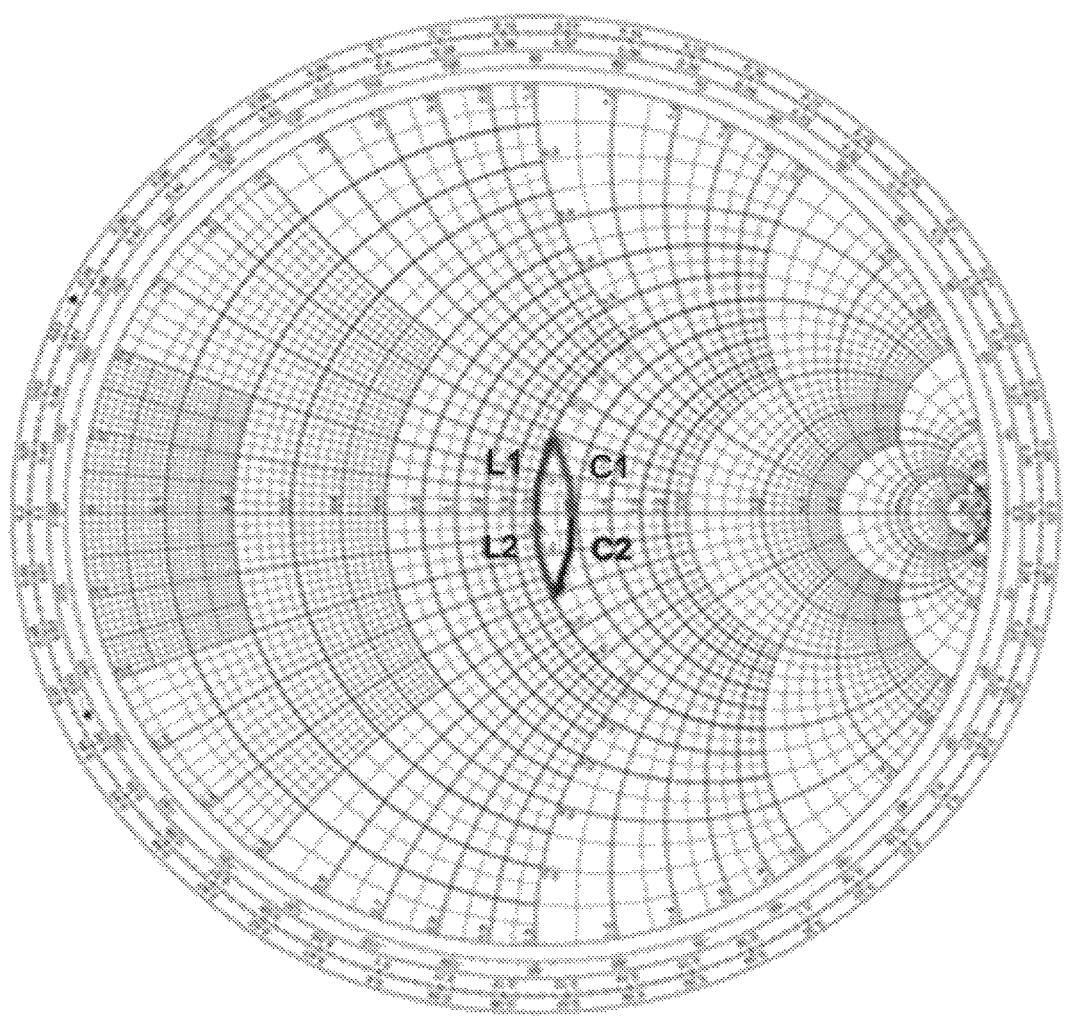
FIG. 22 is an illustration of impedance of the self-matching phase shifter of FIG. 5, plotted on a Smith chart, as the switches are activated in a four-step sequence.

FIG. 22 is an illustration of impedance of the self-matching phase shifter 500, plotted on a Smith chart, as the switches are activated in a four-step sequence. It can be seen that this sequence results in the impedance at the end of this four-step procedure returning to the starting value, such that step 4 has the same impedance as phase step 0.

At least a first four-step procedure includes: (1) activating a first bypass switch; (2) activating a first ground switch; (3) activating a second ground switch; and (4) activating a second bypass switch. This four-step procedure can either be repeated or a second four-step procedure can be implemented including: (1) activating a first ground switch; (2) activating a first bypass switch; (3) activating a second bypass switch; and (4) activating a second ground switch. Any number of the first and second four-step procedures can be concatenated in any order. In some embodiments, within a particular four-step procedure, the first bypass switch and the first ground switch are in the same element 502. Likewise, the second bypass switch and the second ground switch are in the same element 502. Similar processes can be repeated using components of other elements 502. At the end of each four-step procedure, the impedance returns to the starting value.

In the case shown in FIG. 22, a first series inductance L1 (such as provided by the inductor 512a when bypass switch 514a is activated) is introduced, followed the introduction of a first shunt capacitance C1 (such as provided by the capacitor 508a when ground switch 510a is activated), which is then followed the introduction of a second series inductor L2 (such as provided by inductor 512b upon activating bypass switch 514b) which is then followed by introduction of a second shunt capacitor (such as capacitor 508b when ground switch 510b is activated).

In some embodiments in which both switches 510, 514 of an element 502 are activated together to impart a single step, the number of steps determines the number of elements 502 (i.e., the number of pairs of ground switches 510 and bypass switches 514) to be activated. Accordingly, an equal number of ground switches 510 and bypass switches 514 are active in each State. Alternatively, in some embodiments in which a ground switch 510 is always activated together with a bypass switch 514, the ground switch 510 and the bypass switch 514 need not be in the same element 502. In any of the above cases, the control interface 520 activates the selected switches 510, 514 by outputting control signals [STEP 2107].

Fabrication Technologies and Options

As should be readily apparent to one of ordinary skill in the art, various embodiments of the claimed invention can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, in some cases, the inventive concepts claimed may be particularly useful with an SOI-based fabrication process (including SOS), and with fabrication processes having similar characteristics.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. A self-matching phase shifter including a plurality of phase shifter elements, at least one phase shifter element including:
  (a) an input port;
  (b) an output port;
  (c) a shunt reactive component having a first terminal and a second terminal, the first terminal coupled to the input port;
  (d) a ground switch having a first and second switch terminal and a control terminal, the first terminal coupled to the second terminal of the shunt reactive component and the second terminal coupled to ground;
  (e) a series reactive component having a first terminal and a second terminal, the first terminal coupled to the input port and second terminal coupled to the output port; and
  (f) a bypass switch having a first and second switch terminal and a control terminal, the first switch terminal coupled to the first terminal of the series reactive component and the second switch terminal coupled to the second terminal of the series reactive component;
wherein a reactance of the shunt reactive component is within 25% of the inverse of the reactance of the series reactive component.

2. A self-matching phase shifter including a plurality of phase shifter elements, at least one phase shifter element including:
   (a) an input port;
   (b) an output port;
   (c) a shunt reactive component having a first terminal and a second terminal, the first terminal coupled to the input port;
   (d) a ground switch having a first and second switch terminal and a control terminal, the first terminal coupled to the second terminal of the shunt reactive component and the second terminal coupled to ground;
   (e) a series reactive component having a first terminal and a second terminal, the first terminal coupled to the input port and second terminal coupled to the output port;
   (f) a bypass switch having a first and second switch terminal and a control terminal, the first switch terminal coupled to the first terminal of the series reactive component and the second switch terminal coupled to the second terminal of the series reactive component; and
   (g) a phase shift control interface, wherein the control interface includes:
      (1) control logic for receiving a desired amount of phase shift; and
      (2) control signal output ports coupled to the control terminals of the switches to activate the ground switches and bypass switches within each of the phase shifter elements to impart the desired phase shift on signals applied to the phase shifter
   wherein the control logic ensures that the difference between the number of active ground switches and the number of active bypass switches is no greater than 1.

3. The phase shifter of claim 2, wherein each of the ground switches and bypass switches are associated with a binary type phase shift weight.

4. The phase shifter of claim 2, wherein the shunt reactive component is a capacitor and the series reactive component is an inductor.

5. The phase shifter of claim 2, wherein the shunt reactive component is an inductor and the series reactive component is a capacitor.

6. The phase shifter of claim 2, having a first plurality of phase shifter elements in which the ground switches and bypass switches are associated with thermometer type phase shift weights and at least one phase shifter element in which the ground switch and bypass switches are associated with binary type phase shift weights.

7. The phase shifter of claim 6, wherein the at least one phase shifter element having ground switch and bypass switch associated with binary type phase shift weights includes two series elements and one shunt element.

8. The phase shifter of claim 6, wherein the at least one phase shifter element having ground switch and bypass switch associated with binary type phase shift weights includes one series element and two shunt elements.

9. The phase shifter of claim 8, wherein the reactance of the capacitor is equal to the inverse of the reactance of the inductor at operational frequencies.

10. The phase shifter of claim 2, wherein the control logic activates the switches in pairs, each pair including one ground switch and one bypass switch.

11. A self-impedance matching attenuator including a plurality of attenuation elements, at least one of the attenuation elements including:
   (a) an input port;
   (b) an output port;
   (c) a shunt resistive component having a first terminal and a second terminal, the first terminal coupled to the input port;
   (d) a ground switch having a first and second switch terminal and a control terminal, the first terminal coupled to the second terminal of the shunt resistive component and the second terminal coupled to ground;
   (e) a series resistive component having a first terminal and a second terminal, the first terminal coupled to the input port and the second terminal coupled to the output port; and
   (f) a bypass switch having a first and second switch terminal and a control terminal, the first switch terminal coupled to the first terminal of the series resistive component and the second switch terminal coupled to the second terminal of the series resistive component;
   wherein at least two of the attenuation elements are thermometer weighted and at least one of the attenuation elements are binary weighted with respect to the thermometer weighted attenuation elements.

12. The attenuator of claim 11, wherein the attenuation elements are thermometer weighted.

13. The attenuator of claim 11, wherein the attenuation elements are binary weighted.

14. A method for imparting a phase shift to a signal in discrete steps, the phase shifter having various States, each State being defined by the number of discrete steps of phase shift imparted in that State, the method including:
   (a) coupling the signal to a self-matching phase shifter;
   (b) determining a desired phase shift;
   (c) determining in which State to place the phase shifter to impart the desired phase shift;
   (d) determining which switches to activate to place the phase shifter in the desired State such that a number of ground switches are activated and a number of bypass switches are activated to impart the desired phase shift, the difference between the number of ground switches and the number of bypass switches is no greater than 1; and
   (e) outputting control signals to the switches to activate the switches,
   wherein a number of a State indicates the number of steps in that State and odd numbered States have one more active ground switch than bypass switch.

15. The method of claim 14, wherein even numbered States have an equal number of active ground switches and bypass switches.

16. The method of claim 14, wherein a number of a State indicates the number of steps in that State and odd numbered States have one more active bypass switch than ground switch.

17. The method of claim 16, wherein even numbered States have an equal number of active ground switches and bypass switches.

18. The method of claim 14, wherein at least a first four step procedure is implemented to determine the sequence in which to activate switches, the first four step procedure including:
   (a) activating a first bypass switch;
   (b) activating a first ground switch;
   (c) activating a second ground switch; and
   (d) activating a second bypass switch.

19. The method of claim 18, further including implementing at least a second four step procedure, the second four step procedure including:
(a) activating a first ground switch;
(b) activating a first bypass switch;
(c) activating a second bypass switch; and
(d) activating a second ground switch.

20. The method of claim 14, wherein at least a first four step procedure is implemented to determine the sequence in which to activate switches, the first four step procedure including:
(a) activating a first ground switch;
(b) activating a first bypass switch;
(c) activating a second bypass switch; and
(d) activating a second ground switch.

21. The method of claim 20, wherein at least a second four step procedure, the second four step procedure including:
(a) activating a first bypass switch;
(b) activating a first ground switch;
(c) activating a second ground switch; and
(d) activating a second bypass switch.

* * * * *